(12) United States Patent
Ohashi et al.

(10) Patent No.: US 7,479,845 B2
(45) Date of Patent: *Jan. 20, 2009

(54) BRANCHING FILTER PACKAGE

(75) Inventors: Wataru Ohashi, Tokyo (JP); Hajime Shimamura, Tokyo (JP); Tomokazu Komazaki, Tokyo (JP); Yoshiaki Fujita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/032,145

(22) Filed: Jan. 11, 2005

(65) Prior Publication Data

US 2005/0122187 A1    Jun. 9, 2005

Related U.S. Application Data

(60) Division of application No. 10/114,326, filed on Apr. 3, 2002, now Pat. No. 6,937,113, which is a continuation-in-part of application No. 09/450,997, filed on Nov. 29, 1999, now abandoned, which is a continuation-in-part of application No. 09/305,304, filed on May 5, 1999, now Pat. No. 6,222,426, application No. 10/114,326, which is a continuation-in-part of application No. 09/785,501, filed on Feb. 2, 2001, now Pat. No. 6,870,440, which is a division of application No. 09/305,304.

(30) Foreign Application Priority Data

Jun. 9, 1998 (JP) ............................... 10-160088
May 28, 1999 (JP) ..................................... 149959

(51) Int. Cl.
*H03H 9/72* (2006.01)

(52) U.S. Cl. ...................................... 333/133; 333/193

(58) Field of Classification Search ......... 333/193–196, 333/133
See application file for complete search history.

(56) References Cited

U.S. PATENT DOCUMENTS

| | | | |
|---|---|---|---|
| 4,910,481 A | 3/1990 | Sasaki et al. | 333/134 |
| 5,365,209 A | 11/1994 | Ito et al. | 333/206 |
| 5,459,368 A | 10/1995 | Onishi et al. | |
| 5,554,960 A | 9/1996 | Ohnuki et al. | 333/132 |

(Continued)

FOREIGN PATENT DOCUMENTS

JP    58 197912    11/1983

(Continued)

OTHER PUBLICATIONS

U.S. Appl. No. 09/210,746, filed Dec. 15, 1998.

(Continued)

*Primary Examiner*—Barbara Summons
(74) *Attorney, Agent, or Firm*—Venable LLP; Michael A. Sartori; Kyle D. Petaja

(57) ABSTRACT

A branching filter package has a SAW filter chip housing area which houses a piezo electric base, on which a transmitting SAW filter and a receiving SAW filter having a different frequency passing band with each other, are formed, and an impedance matching circuit and a branching circuit for the transmitting SAW filter and the receiving SAW filter.

16 Claims, 17 Drawing Sheets

U.S. PATENT DOCUMENTS

| | | | |
|---|---|---|---|
| 5,561,406 A | 10/1996 | Ikata et al. | 333/126 |
| 5,631,612 A | 5/1997 | Satoh et al. | 333/193 |
| 5,652,599 A | 7/1997 | Pitta et al. | 343/858 |
| 5,654,680 A | 8/1997 | Kwan et al. | 333/195 |
| 5,666,091 A | 9/1997 | Hikita et al. | 333/193 |
| 5,726,610 A | 3/1998 | Allen et al. | 333/133 |
| 5,786,738 A | 7/1998 | Ikata et al. | 333/133 |
| 5,854,579 A * | 12/1998 | Penunuri | 333/193 |
| 5,859,473 A | 1/1999 | Ikata et al. | 257/723 |
| 5,864,260 A | 1/1999 | Lee | 333/133 |
| 5,905,418 A | 5/1999 | Ehara et al. | 333/193 |
| 5,936,483 A | 8/1999 | Ikada | 333/133 |
| 5,952,899 A * | 9/1999 | Kadota et al. | 333/193 |
| 5,966,060 A | 10/1999 | Ikada | 333/193 |
| 6,057,744 A | 5/2000 | Ikada | 333/133 |
| 6,115,592 A | 9/2000 | Ueda et al. | |
| 6,121,859 A | 9/2000 | Takahashi | 333/193 |
| 6,150,900 A | 11/2000 | Kadota et al. | 333/133 |
| 6,201,457 B1 | 3/2001 | Hickernell | 333/193 |
| 6,222,426 B1 | 4/2001 | Komazaki et al. | |
| 6,236,291 B1 | 5/2001 | Sonoda et al. | 333/202 |
| 6,377,138 B1 | 4/2002 | Takagi et al. | |
| 6,650,205 B2 | 11/2003 | Goetz et al. | 333/193 |
| 6,870,440 B2 | 3/2005 | Komazaki et al. | |
| 6,937,113 B2 * | 8/2005 | Ohashi et al. | 333/133 |

FOREIGN PATENT DOCUMENTS

| | | |
|---|---|---|
| JP | 62-171327 | 7/1987 |
| JP | 04-016014 A | 1/1992 |
| JP | A 04-369111 | 12/1992 |
| JP | 05-36890 U | 5/1993 |
| JP | 5-167388 | 7/1993 |
| JP | 05-167389 A | 7/1993 |
| JP | 05-251987 A | 9/1993 |
| JP | A 05-299969 | 11/1993 |
| JP | 0697761 | 4/1994 |
| JP | 06350307 | 12/1994 |
| JP | 7-38376 | 2/1995 |
| JP | 07-16427 U | 3/1995 |
| JP | A 07-099420 | 4/1995 |
| JP | 07-226607 A | 8/1995 |
| JP | A 08-018393 | 1/1996 |
| JP | 9-98046 | 4/1997 |
| JP | A 09-181565 | 7/1997 |
| JP | A 10-070435 | 3/1998 |
| JP | A 10-242800 | 9/1998 |
| JP | 10-341135 A | 12/1998 |
| JP | 11-68512 | 3/1999 |
| WO | WO 98 19394 | 5/1998 |
| WO | WO/99/05788 | 2/1999 |

OTHER PUBLICATIONS

U.S. Appl. No. 09/305,304, filed May 5, 1999.

Office Action from JPO of JP2005-014496 (dated Jan. 8, 2008) and English Translation.

Office Action from JPO of JP2005-014496 (dated May 20, 2008) and English Translation.

Office Action from JPO of JP2007-304397 (dated Feb. 19, 2008) and English Translation.

Office action from JPO of JP2007-304397 (dated May 20, 2008) and English Translation.

\* cited by examiner

| TRANSMITTING FILTER | TS1 | | TS2 | | TS3 | | TS4 | |
|---|---|---|---|---|---|---|---|---|
| | CROSS LENGTH (μm) | LOGARITHM | CROSS LENGTH (μm) | LOGARITHM | CROSS LENGTH (μm) | LOGARITHM | CROSS LENGTH (μm) | LOGARITHM |
| | 85 | 90 | 42.5 | 90 | 84 | 86 | 60 | 60 |

| RECEIVING FILTER | SERIAL ARM | RxS | | RS1 | | RS2 | | RS3 | |
|---|---|---|---|---|---|---|---|---|---|
| | | CROSS LENGTH (μm) | LOGARITHM | CROSS LENGTH (μm) | LOGARITHM | CROSS LENGTH (μm) | LOGARITHM | CROSS LENGTH (μm) | LOGARITHM |
| | | 124 | 90 | 124 | 90 | 62 | 90 | 62 | 90 |
| | PARALLEL ARM | | | RP1 | | RP2 | | RP3 | |
| | | | | CROSS LENGTH (μm) | LOGARITHM | CROSS LENGTH (μm) | LOGARITHM | CROSS LENGTH (μm) | LOGARITHM |
| | | | | 102 | 120 | 102 | 120 | 76 | 80 |

FIG. 8

| | BRANCHING CIRCUIT (LINE OR ELEMENT VALUE) | | TRANSMITTING FILTER | | | | RECEIVING FILTER | | | |
|---|---|---|---|---|---|---|---|---|---|---|
| | LT | LR | 890(Hz) | 915(Hz) | 935(Hz) | 960(Hz) | 890(Hz) | 915(Hz) | 960(Hz) | 960(Hz) |
| A | 0(mm) | 40(mm) | 1.22(dB) | 1.17(dB) | 35.7(dB) | 36.8(dB) | 31.6(dB) | 58.8(dB) | 3.11(dB) | 3.04(dB) |
| B | 0(mm) | 0(mm) | 3.56(dB) | 3.21(dB) | 37.9(dB) | 28.6(dB) | 33.0(dB) | 55.6(dB) | 3.11(dB) | 2.32(dB) |
| C | L_ANT=7(nH) | C_ANT=10(pF) | 1.28(dB) | 1.28(dB) | 36.6(dB) | 35.0(dB) | 34.1(dB) | 59.0(dB) | 3.28(dB) | 3.20(dB) |
| D | L_ANT=7(nH) | | 1.30(dB) | 1.32(dB) | 34.7(dB) | 33.2(dB) | 35.1(dB) | 58.5(dB) | 3.74(dB) | 4.0(dB) |
| E | L_ANT=10(nH) | | 1.37(dB) | 1.08(dB) | 36.1(dB) | 29.2(dB) | 35.5(dB) | 54.7(dB) | 3.10(dB) | 3.70(dB) |

Rx FILTER SIDE BRANCHING CIRCUIT RESONATOR=120μm, 90 PAIRS

FIG. 9

| | | TRANSMITTING FILTER | | | | | RECEIVING FILTER | | | |
|---|---|---|---|---|---|---|---|---|---|---|
| | | 890 | 900 | 915 | 935 | 960 | 890 | 900 | 915 | 935 | 960 |
| BRANCHING FILTER B | REAL PART | 1.283 | 0.8627 | 1.345 | 2.313 | 0.0831 | 0.0127 | 0.0175 | 0.0320 | 0.606 | 0.7414 |
| | IMAGINARY PART | -0.816 | -.6256 | 0.5287 | 0.8715 | -4.017 | -1.098 | -0.934 | -0.654 | -0.017 | 1.263 |
| BRANCHING FILTER D | REAL PART | 1.283 | 0.8627 | 1.345 | 2.313 | 0.0831 | 3.540 | 4.7507 | 0.435 | 0.875 | 0.2421 |
| | IMAGINARY PART | -0.816 | -.6256 | 0.5287 | 0.8715 | -4.017 | 23.20 | | | 0.0479 | 1.150 |

FIG. 10

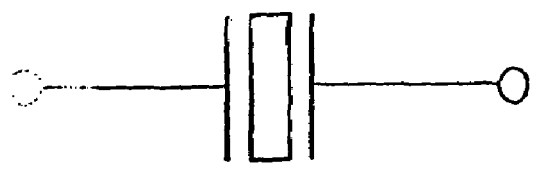
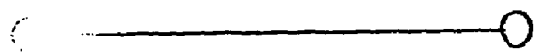
FIG.11A
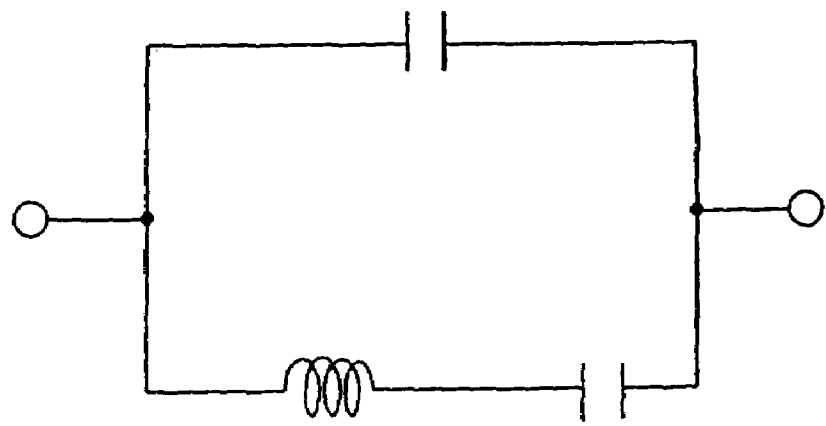
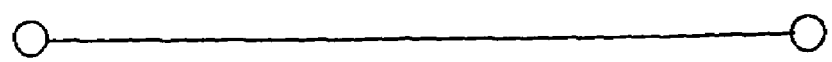
FIG.11B

| | CONNECTION LINE LENGTH (mm) | OPEN CIRCUIT LINE LENGTH (mm) | LINE WIDTH (mm) | LINE THICKNESS (mm) | BOARD THICKNESS (mm) |
|---|---|---|---|---|---|
| TRANSMITTER INPUT MATCHING CIRCUIT | 11.85 | 10.32 | 0.1 | 0.02 | 0.4 |
| ANTENNA END MATCHING CIRCUIT | 12.85 | 12.16 | 0.1 | 0.02 | 0.4 |
| RECEIVER OUTPUT MATCHING CIRCUIT | 15.42 | 10.46 | 0.1 | 0.02 | 0.4 |

FIG.18

|  | L (nH) | C (pF) | $Z_0(\Omega)$ |
|---|---|---|---|
| TRANSMITTER INPUT MATCHING CIRCUIT | 4.73 | 1.65 | 53.6 |
| ANTENNA END MATCHING CIRCUIT | 5.13 | 1.77 | 53.6 |
| RECEIVER OUTPUT MATCHING CIRCUIT | 6.16 | 2.14 | 53.6 |

FIG.19

| INPUT IMPEDANCE $Z_{in}(\Omega)$ | TERMINAL IMPEDANCE $Z_n(\Omega)$ |
|---|---|
| 46.7−j18.2 | 30 |
| 60.4−j6.56 | 40 |
| 71.3+j14.5 | 50 |

FIG.20

BRANCHING FILTER PACKAGE

CROSS-REFERENCE TO RELATED APPLICATIONS

This application is a Division of U.S. patent application Ser. No. 10/114,326 filed Apr. 3, 2002, now U.S. Pat. No. 6,937,113, which is a Continuation-In-Part of U.S. patent application Ser. No. 09/450,997, filed Nov. 29, 1999, now abandoned, which claims the benefit of Japan Patent Application No. 149959, filed May 28, 1999, and which is a Continuation-In-Part of U.S. application Ser. No. 09/305.304, filed May 5, 1999 now U.S. Pat. No. 6,222,426, all of which are incorporated herein by reference.

U.S. patent application Ser. No. 10/114,326, filed Apr. 3, 2002, now U.S. Pat. No. 6,937,113, is also a Continuation-In-Part of U.S. patent application Ser. No. 09/785,501, filed Feb. 2, 2001, now U.S. Pat. No. 6,870,440, which is a Division of U.S. Pat. No. 09/305,304, filed May 5, 1999, now U.S. Pat. No. 6,222,426, which claims the benefit of Japan Patent Application No. 10-160088, filed Jun. 9, 1998, all of which are incorporated herein by reference.

BACKGROUND OF THE INVENTION

1. Field of the Invention

The present invention relates to a branching filter that is used in small mobile communication devices such as mobile cellular phones. In particular, the present invention relates to branching filters and the construction of branching filter packages that use a high Radio Frequency (RF) filter as an elastic Surface Acoustic Wave (SAW) resonator type filter (called a SAW filter below) to achieve increased miniaturization and high performance.

2. Description of the Related Art

In recent years, the development of small and light-weight mobile communication devices, typified by devices such as mobile cellular phones, is advancing rapidly. With such advances come the demand for further miniaturization and higher performance of branching filters that are used by such mobile communication devices. Devices like the SAW branching filter, which uses a SAW filter, has tremendous potential for achieving further miniaturization of the mobile communication devices. In addition, they are also required to have small insertion losses at the pass band and large attenuation at the attenuation band.

SAW branching filters used in conventional mobile communication terminal devices such as mobile cellular phones have been disclosed in Japanese Patent Application Laid-Open No. H6-97761. In this type of SAW branching filter, the impedance matching circuit located between the antenna terminal and the receiver terminal, and the receiver filter, are connected in a serial manner. In addition, the phase matching circuit located between the antenna terminal and the receiver terminal, and the receiver filter, are connected in a serial manner. Furthermore, both the transmitting filter and the receiving filter form a ladder type resonator filter by arranging the serial arm SAW resonator and the parallel arm SAW resonator.

Due to the fact that such filters possess different center frequencies, for the various filters used for transmitting and receiving, the insertion losses at the frequency pass band is smaller and the attenuation at the frequency damping band is large in comparison. In order to suppress the mutual interference between the transmitting filter and the receiving filter that have different characteristics, it is necessary to maintain insulation between the transmitting SAW branching filter and the receiving branching filter described above. For example, the transmitting filter and the receiving filter are formed on different piezo electric base boards.

When the two filters are housed in the same filter package, it is necessary to decide whether to house the two filters in separate cavities that exist in the package (where the transmitting and receiving filters are separated using the wall of the package), or to house the transmitting and receiving filters in one cavity of the package while maintaining proper isolation between the two filters by keeping a certain distance between the two filters. In addition, the phase matching circuit and the impedance matching circuit are also formed together with the transmitting and receiving filters on the same package.

SUMMARY OF THE INVENTION

It is therefore the objective of the present invention to provide a branching filter package that overcomes the above issues in the related art. By using a SAW filter chip that has a housing area for the housing of piezo electric base board which forms the transmitting SAW filter and the receiving SAW filter with different frequency passing band, the present invention provides a branching filter package that forms the transmitting SAW filter and the receiving SAW filter, and the related impedance matching circuit and the branching circuit.

The present invention makes is possible to build a highly reliable and miniaturized branching filter. This is achieved by a combination of new designs described in the independent claims. The dependent claims define further advantageous and exemplary combinations of the present invention. This summary of the invention does not necessarily describe all necessary features so that the invention may also be a sub-combination of these described features.

BRIEF DESCRIPTION OF THE DRAWINGS

FIG. 8 shows simulation values for the SAW resonator of FIG. 2.

FIG. 9 shows simulation values for various branching filters.

FIG. 10 shows simulation values for various branching filters.

FIG. 11A and FIG. 11B show the serial arm SAW resonator circuit diagram and its equivalent LC circuit diagram.

FIG. 18 shows a connection line length, an open circuit length, a line width, a line thickness, and a board thickness for each of a transmitting input matching circuit, an antenna end matching circuit, and a receiver output matching circuit.

FIG. 19 shows the equivalent LC value of FIG. 14.

FIG. 20 shows the change in input impedance $Z_{in}$ according to the changes of the terminal impedance $Z_n$.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
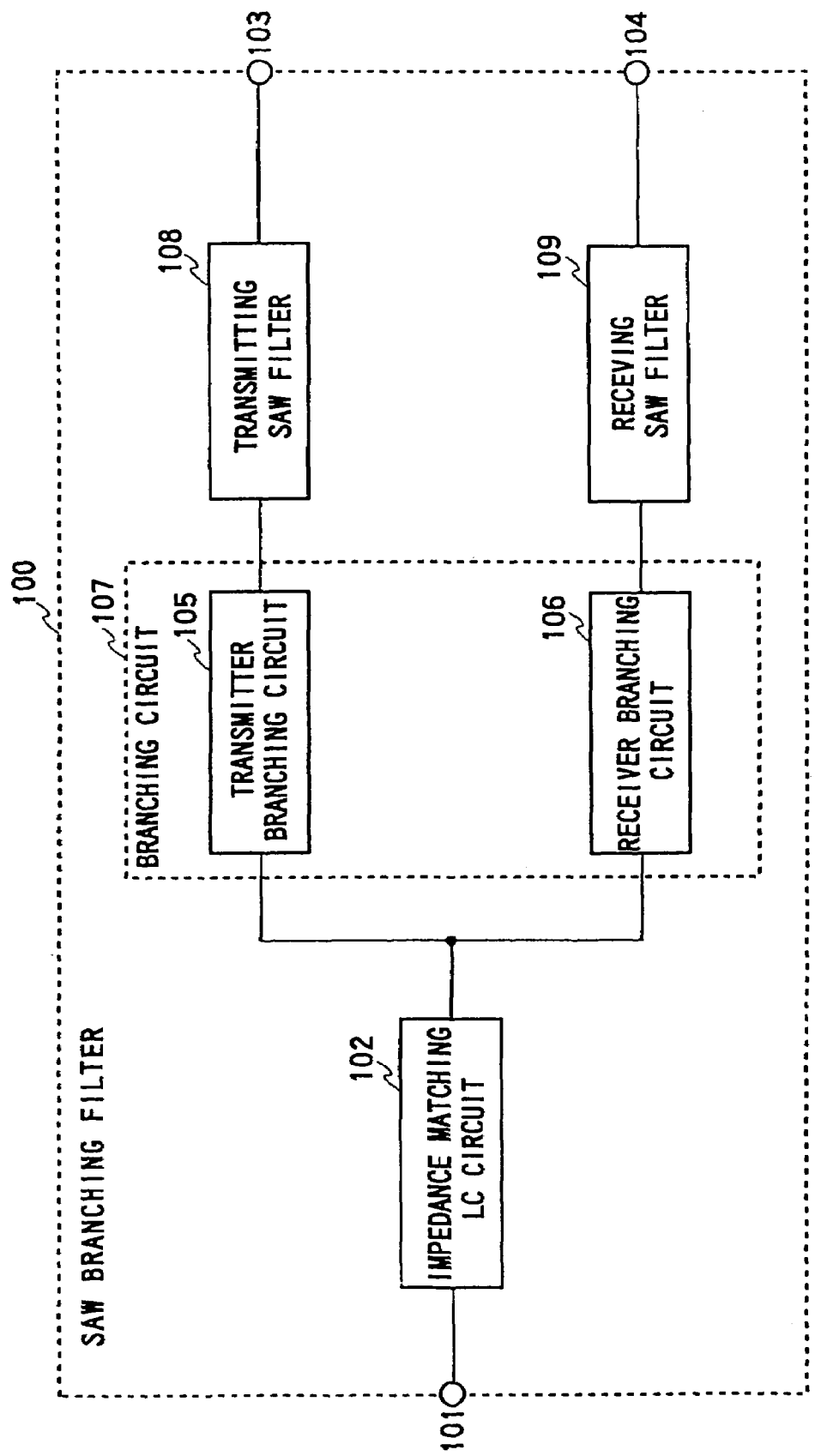
FIG. 1 illustrates an example of the structure of the SAW branching filter described in the first embodiment of the present invention.

FIG. 1 is the block diagram showing an example of the structure of the SAW branching filter described in the first embodiment of the present invention. As shown in FIG. 1, the SAW branching filter 100 comprises the antenna terminal 101, transmitting terminal 103 and receiving terminal 104. The impedance matching LC circuit 102 is connected to the antenna terminal 101. The transmitting side branching circuit (called the Tx-branching circuit from now on) 105 and the transmitting SAW filter 108 are connected between the impedance matching LC circuit 102 and the transmitting terminal 103.

The receiving side branching circuit (called the Rx-branching circuit from now on) 106 and the receiving SAW filter 109 are connected between the impedance matching LC circuit 102 and the receiving SAW filter 109. The transmitting SAW filter 108 and the receiving SAW filter 109 have different frequency pass bands. Although the branching circuit 107 is constructed from the Tx-branching circuit 105 and the Rx-branching circuit 106, depending on the design requirements, Tx-branching circuit 105 does not have to be included.

Figure 2:
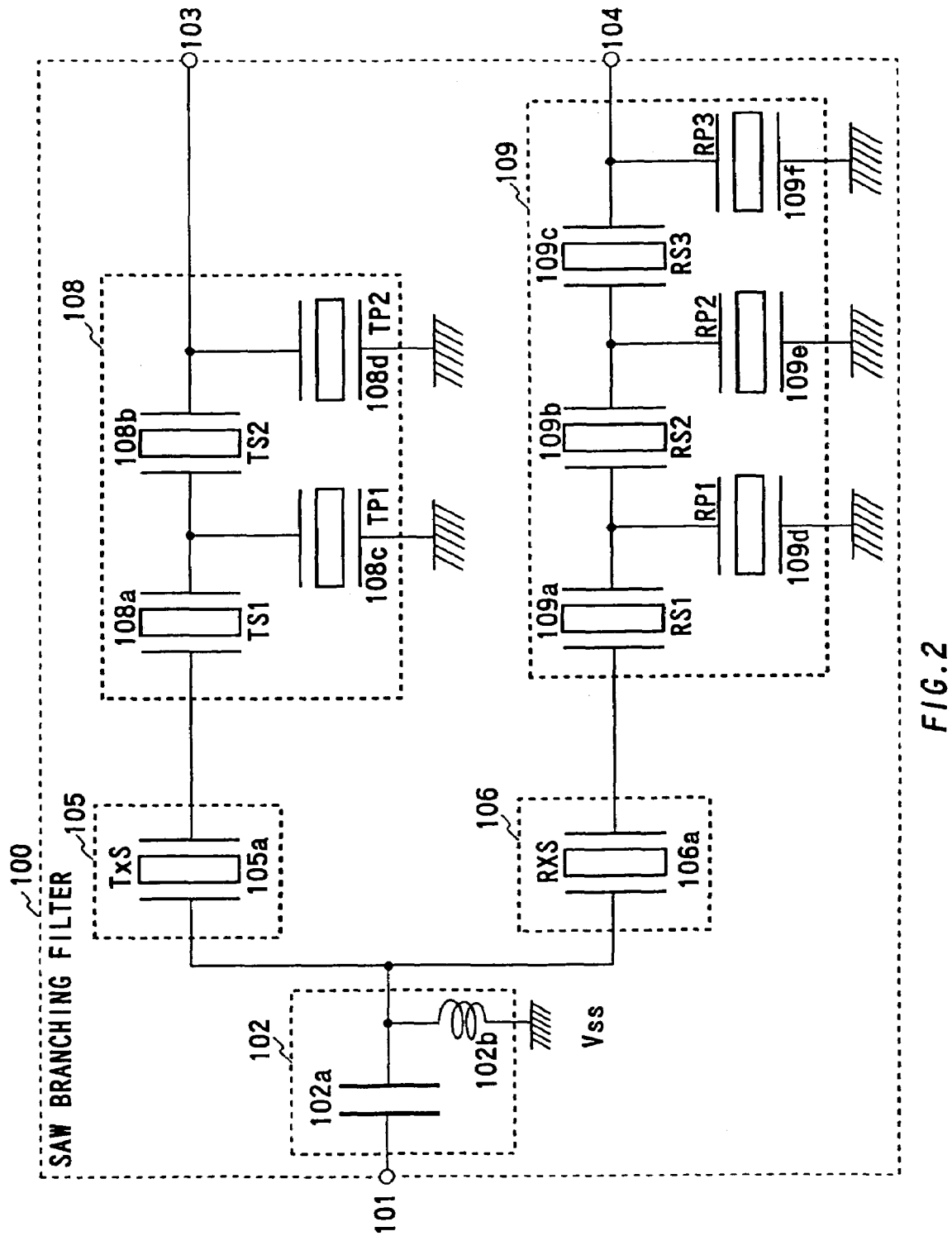
FIG. 2 shows the concrete circuit structure of the SAW branching filter described in the first embodiment of the present invention.
Figure 3:
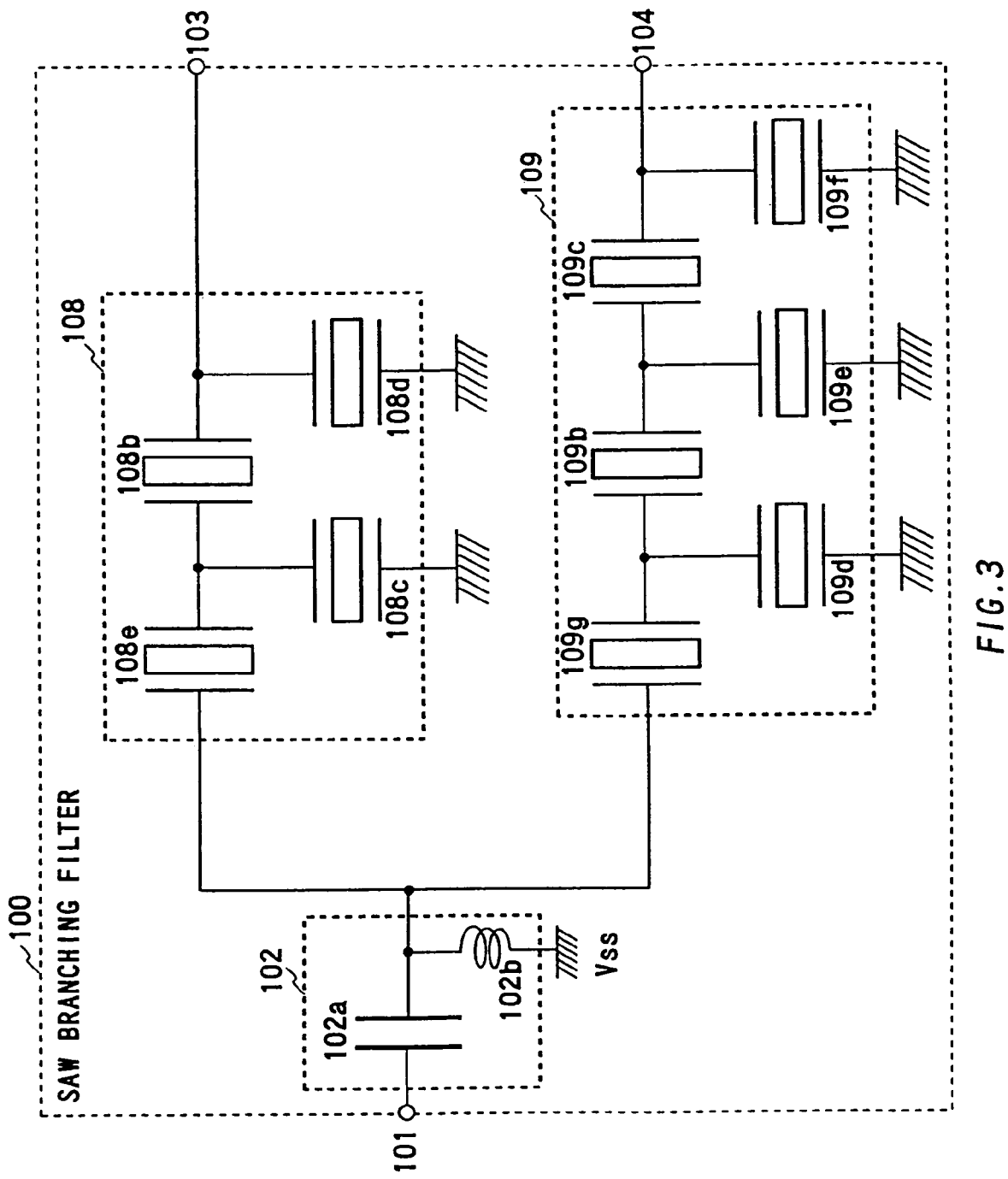
FIG. 3 shows the concrete circuit structure of the SAW branching filter described in the first embodiment of the present invention.

FIG. 2 and FIG. 3 shows concrete circuit structure diagrams for the above SAW branching filter 100 which includes both the Tx-branching circuit 105 and the Rx-branching circuit 106.

As shown in FIG. 2, the transmitting SAW filter 108 comprises a three stage ladder type SAW resonators made up from two serial arm SAW resonator and a parallel SAW resonator. The serial arm resonator, consists of the first stage number 1 serial arm SAW resonator (TS1) 108a and the second stage number 2 serial arm SAW resonator (TS2) 108b, is connected between the Tx-branching circuit 105 and the transmitting terminal 103. On the other hand, the parallel arm SAW resonator consists of a) the first stage number 1 parallel arm SAW resonator (TP1) 108c, which is connected between the connection point of the first serial arm SAW resonator (TS1) 108a and the second serial arm SAW resonator (TS2) 108b, and ground, and b) the second stage number 2 parallel arm SAW resonator (TP2) 108d, which is connected between the transmitting terminal 103 and ground. Furthermore, each serial arm SAW resonator and each parallel SAW resonator included in the transmitting SAW filter 108 comprises two SAW resonators.

The receiving SAW filter 109 comprises of a five stage ladder type SAW resonator made up from three serial arm SAW resonators and parallel arm SAW resonator. The serial arm SAW resonator is connected between the Rx-branching circuit 106 and the receiving terminal 104, and consists of the first stage number 1 serial arm SAW resonator (RS1) 109a, the second stage number 2 serial arm SAW resonator (RS2) 109b, and the third stage number 3 serial arm SAW resonator (RS3) 109c.

On the other hand, the parallel arm SAW resonator consists of a) the first stage number 1 parallel arm SAW resonator (RP1) 109d which is connected between the connection point of the number 1 serial arm SAW resonator (RS1) 109a and number 2 serial arm SAW resonator (RS2) 109b, and ground, b) the second stage number 2 parallel arm SAW resonator (RP2) 109e, which is connected between the connection point between the number 2 serial arm SAW resonator (RS2) 109b and the number 3 serial arm SAW resonator (RS3) 109c, and ground, and c) the third stage number 3 parallel SAW resonator (RP3) 109f, which is connected between the transmitting terminal 104 and ground. Furthermore, in order to allow miniaturization of SAW branching filter 100, Tx-branching circuit 105 uses the serial arm type SAW resonator (TxS) 105a, and the Rx-branching circuit 106 uses the serial arm type SAW resonator (RxS) 106a. The impedance matching LC circuit 102 consists of capacitor C$_{ANT}$ 102a and inductor L$_{ANT}$ 102B.

Here as shown in FIG. 3, in order to achieve further miniaturization for SAW branching filter 100, the number 1 serial arm SAW resonator (TS1) 108a used by the transmitting SAW filter 108, and the serial arm SAW resonator (TxS) 105a of the Tx-branching circuit 105, are combined as a combination SAW resonator 108e. Similarly, the number 1 serial arm SAW resonator (RS1) 109a used by the receiving SAW filter 109, and the serial arm type SAW resonator (RxS) 106a of the Rx-branching circuit 106, are combined to form the combined resonator 109g.

Figure 4A:
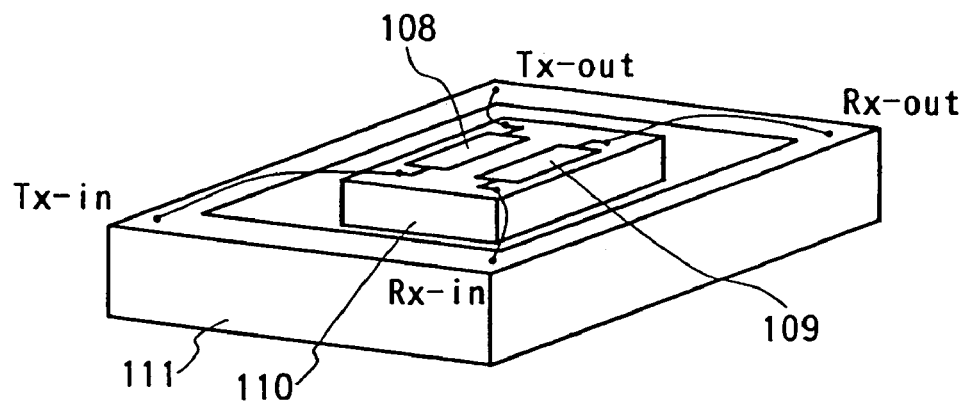
FIG. 4A-FIG. 4C shows the perspective view of the SAW branching filter when housed in the package in the first embodiment of the present invention.

Next, FIG. 4A shows the perspective view of the package base board 111 which houses the piezo electric base board 110 on which the SAW branching filter 100 described above, consisting of the transmitting SAW filter 108 and the receiving SAW filter 109, is formed. As for the package base board, resin base board, low temperature sintering based board, or aluminum base board can be used. In addition, this package base board can be formed using a multiple layered package base board. This will be described in detail in embodiment 2 to embodiment 4. Tx-in and Tx-out shown in FIG. 4A are the input terminal and the output terminal for the transmitting SAW filter 108, respectively. Rx-in and Rx-out are the input terminal and the output terminal for the receiving SAW filter 109, respectively.

The output terminal of the transmitting SAW filter 108 and the input terminal of the receiving SAW filter 109 are both connected with the antenna terminal 101, which is not shown in FIG. 4A. Furthermore, the input terminal of the transmitting SAW filter 108 is related to the transmitting terminal 103 shown in FIG. 1, and the output terminal of the receiving SAW filter 109 is related to the receiving terminal 104 shown in FIG. 1. In this case, the branching circuit 107 and the frequency regulator LC element 102 are formed on the package base board 111, outside of the piezo electric base board 110.

Figure 4B:
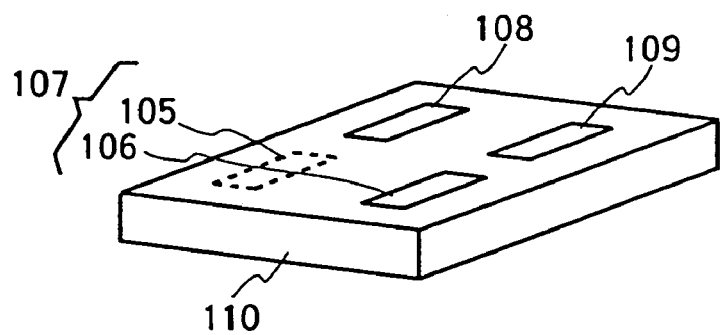

Next, FIG. 4B shows the case in which the branching circuit 107, transmitting SAW filter 108, and the receiving SAW filter 109 are formed on the same piezo electric base board 110. When the Tx-branching circuit 105 and the Rx-branching circuit 106 are included as branching circuit 107, both branching circuits should be housed on the piezo electric base board 110. In addition, in the case where the branching circuit 107 only includes the Rx-branching circuit 106, only the Rx-branching circuit 106 should be housed on the piezo electric base board 110. In FIG. 4B, the necessary connection lines as well as the input and output terminals are omitted, and the Tx-branching circuit 105 is shown in dotted line, and the Rx-branching circuit 106 is shown in solid line. In the case where the structure of the circuit is similar to that shown in FIG. 4B, the impedance matching LC circuit 102 is housed outside of the piezo electric base board 110.

Figure 4C:
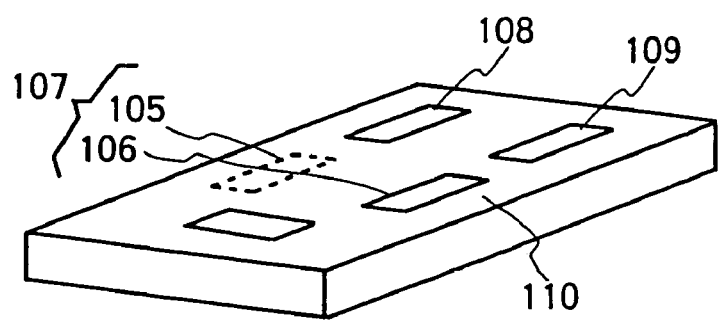

Next, FIG. 4C shows the case in which the impedance matching LC circuit 102, the branching circuit 107, the transmitting SAW filter 108 and the receiving SAW filter 109 are housed on the same piezo electric base board 110. Similar to the example shown in FIG. 4B, when the branching circuit includes the Tx-branching circuit 105 and the Rx-branching circuit 106, both branching circuits should be housed on the piezo electric base board 110. The Tx-branching circuit 105 is also housed according to the design described above. However, in FIG. 4C, the necessary connection circuits, and the input and output terminal are omitted.

The Tx-branching circuit 105 and the Rx-branching circuit 106, which form the SAW branching filter 100, as shown in the above FIG. 4A to FIG. 4C, comprise various serial arm SAW resonators.

Next, the first embodiment of the operation of the SAW branching filter is explained using FIG. 5 to FIG. 10.

Figure 5:
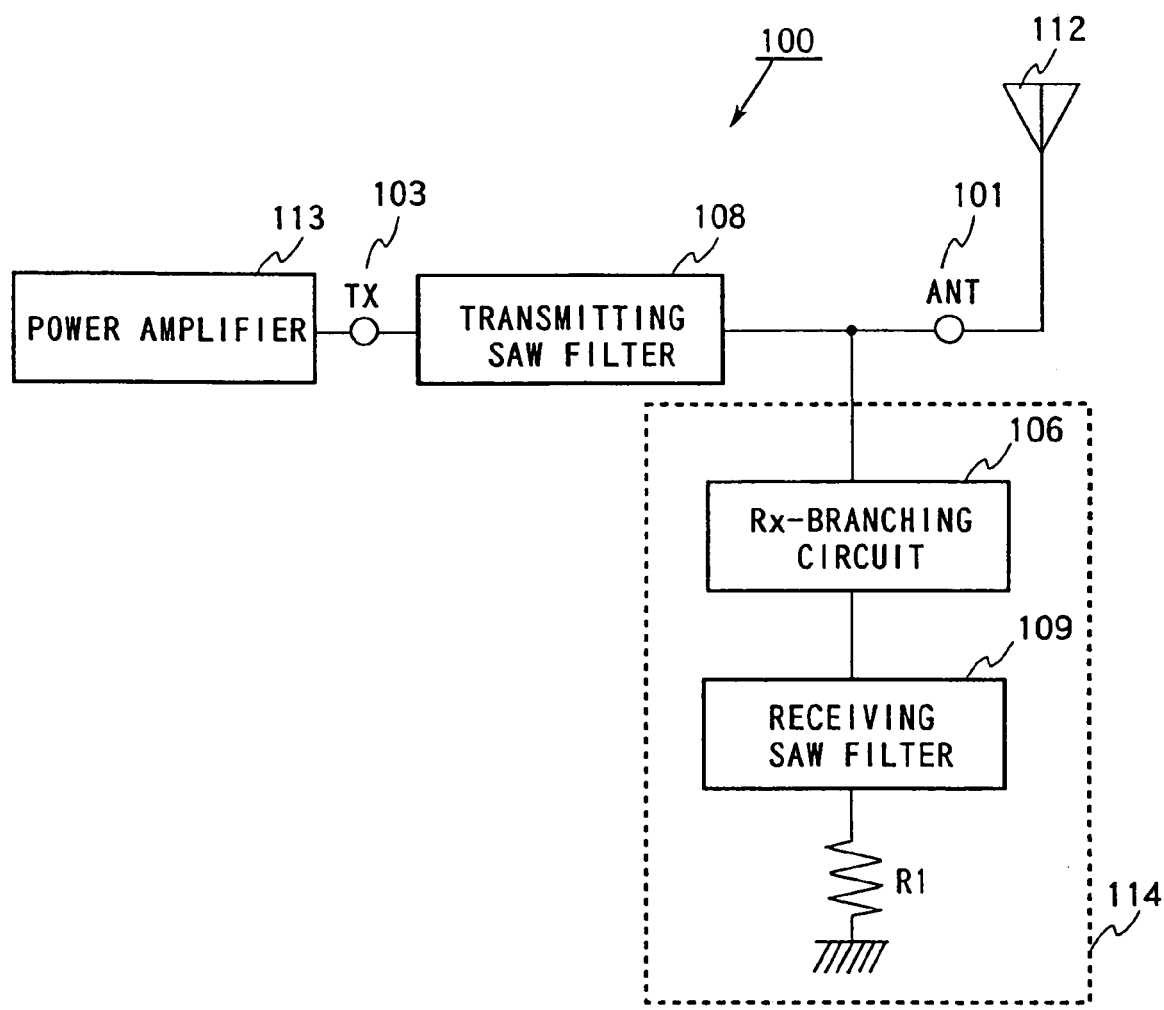
FIG. 5 shows the organization of functions of the SAW branching filter when transmitting action is activated in the first form of the operation of the present invention.
Figure 6:
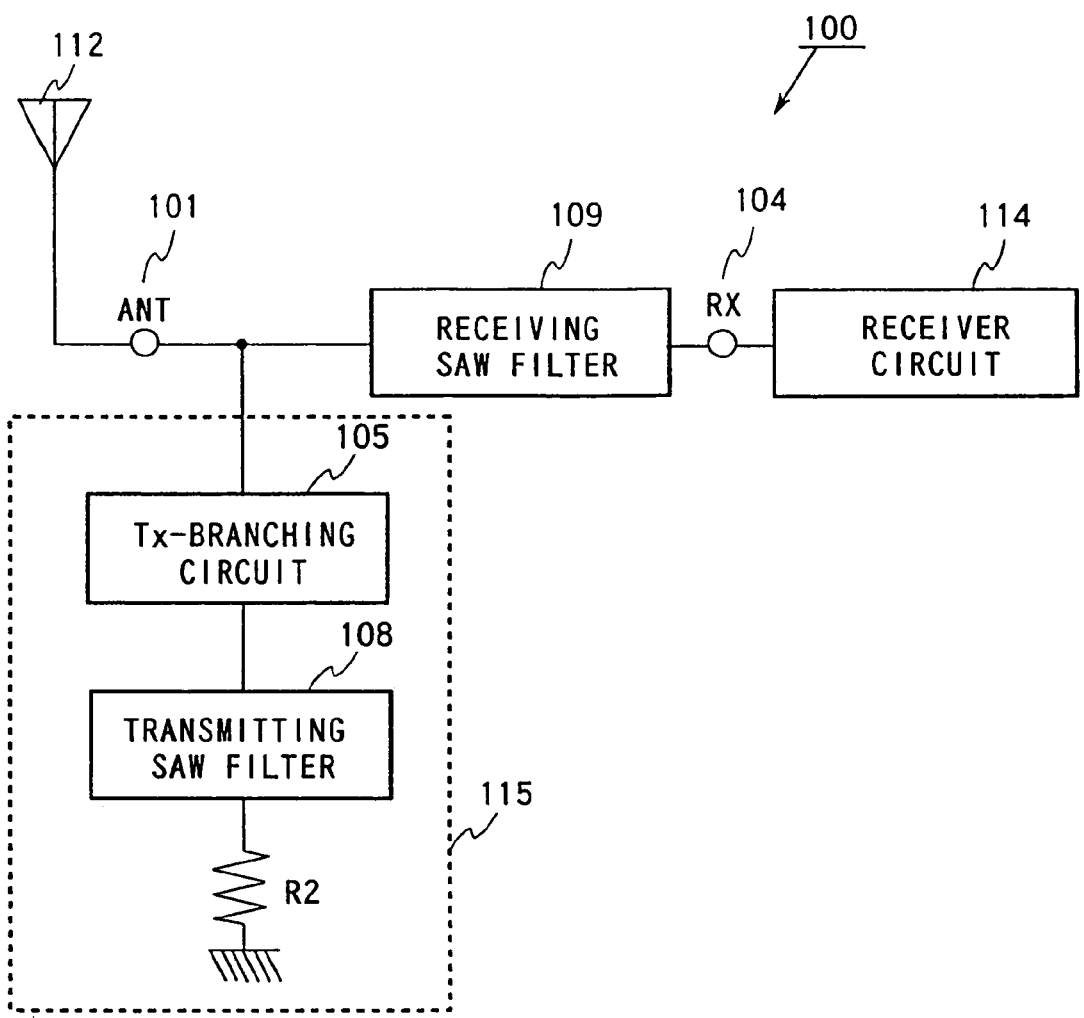
FIG. 6 shows the organization of functions of the SAW branching filter when receiving action is activated in the first form of the operation of the present invention.
Figure 7:
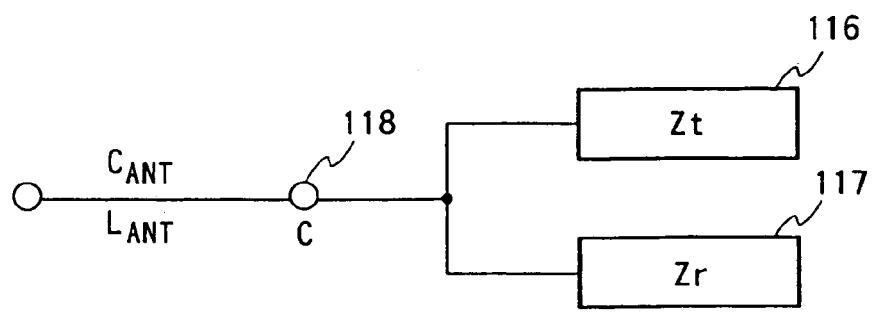
FIG. 7 explains the SAW branching filter impedance in the first form of the operation of the present invention.

FIG. 5 shows the different functions of each component of the SAW branching filter 100 when it is activated for transmitting operations. FIG. 6 shows the different functions of each component of the SAW branching filter 100 when it is activated for receiving operations. FIG. 7 describes the impedance of the SAW branching filter 100.

In general, the branching filter uses only one antenna. Therefore, when a transmitting signal is transmitted and a receiving signal is received, the antenna is shared by both sides and connected directly to both the transmitting related circuit and the receiving related circuit. Due to this reason, the performance of the branching filter has a very large impact on that of small mobile communication devices.

As shown in FIG. 5, when the SAW branching filter 100 is used as a transmitter, the transmitting signal from the power amplifier 113 is sent to the transmitting SAW filter 108 through the transmitting terminal 103. The frequency band of the transmitting signal is first regulated by the transmitting SAW filter 108, and sent to antenna 112 via the antenna terminal 101, before it is transmitted. In this case, the receiving part circuit 114A which consists of the Rx-branching circuit 106, and the receiving. SAW filter 109, together with antenna 112, can be viewed as a load circuit with a combined resistance R1.

In addition, as shown in FIG. 6, when the SAW branching filter is used as a receiver, the signal received from the antenna 112 is sent to the receiving SAW filter 109 via the antenna terminal 101. The frequency pass band of the received signal is regulated by the receiving SAW filter 109, and sent to the receiving part circuit 114B via the receiving terminal 104. In this case, the transmitting part circuit 115 which consists of the Tx-branching circuit 105 and the transmitting SAW filter 108, together with antenna 112, can be viewed as a load circuit with combined resistance R2.

The function of the SAW branching filter 100 during the transmitting operation and the receiving operation can be understood by studying the diagrams shown in FIG. 5 and FIG. 6. As such, the SAW branching filter 100 must satisfy the following necessary conditions if it is to be considered as a high performance branching filter.

$$Z_r \times Z_{ANT}/(Z_r+Z_{ANT}) \simeq 50 \qquad (1\text{-}1)$$

$$Z_r \simeq 8 \qquad (1\text{-}2)$$

On the other hand, if the SAW branching filter 100 is used as a receiver as shown in FIG. 6, let the input impedance of the transmitting part circuit 115 be $Z_t$ 116, this $Z_t$ 116 must satisfy the following approximation equations (1-3) and (1-4).

$$Z_t \times Z_r/(Z_t+Z_r) \simeq 50 \qquad (1\text{-}3)$$

$$Z_r \simeq 8 \qquad (1\text{-}4)$$

If the transmitting frequency band of the mobile cellular phone is from 890 MHz to 915 Mhz, and the receiving frequency band is from 935 MHz to 960 MHz, it is possible to set the receiving frequency passing band of the transmitting SAW filter 108, which is contained in the transmitting part circuit 115, to the hyper frequency range from 930 MHz to 960 MHz, through the serial arm SAW resonator 108a and 108b. Due to this reason, the impedance of the transmitting SAW filter 108 can be made to satisfy the approximation equation (1-3).

However, it is not possible to set the transmitting frequency pass band of the receiving SAW filter 109, which is contained in the receiving part circuit 114, to the hyper frequency range of 890 MHz to 915 MHz, through the serial arm SAW resonator 109a to 109c. For this reason, the input impedance of the receiving SAW filter 109 can not be made to satisfy the approximation equations (1-1) and (1-2).

FIG. 11A shows the circuit diagram of the serial arm SAW resonator used by the SAW branching filter of the present invention. FIG. 11B is the LC equivalent circuit diagram of the serial arm SAW resonator shown in FIG. 11A.

Unlike a conventional branching filter in which the transmitting SAW filter and the receiving SAW filter are formed on different piezo electric base boards, the branching filter described in the present convention has both the transmitting SAW filter and the receiving SAW filter on the same piezo electric base board. A simulation to compare the impedance characteristic during the transmitting operation was conducted. The subject branching filters of this simulation are the SAW branching filter using the GSM type branching filter found in many mobile cellular phones.

The GSM type branching filter does not contain the basic component Tx-branching circuit 105 and inductor $L_{ANT}$ and uses the serial arm SAW resonator 106a as the Rx-branching circuit. Therefore, the frequencies used in this simulation are 890 MHz, 915 MHz, 935 MHz, and 960 MHz, within the range of 890 MHz and 960 MHz.

In this simulation, the transmitting SAW filter for both the conventional branching filter and the GSM (Global System for Mobile communication) type branching filter used in the present invention are constructed in the same way as the transmitting SAW filter 108 shown in FIG. 2. FIG. 8 shows the cross length (μm) and the electrode logarithm of the SAW resonator which forms the transmitting and receiving SAW filter in SAW branching filter 100.

For FIG. 8, as shown in FIG. 2, TS1 and TS2 are the serial arm SAW resonators 108a and 108b, TP1 and TP2 are the parallel SAW resonators 108c and 108d, which form the transmitting SAW filter 108. In addition, RS1 to RS3 are the serial arm SAW resonators 109a to 109c, respectively, and RP1 to RP3 are the parallel arm SAW resonators 109d and 109f, respectively, which form the receiving SAW filter 109.

Furthermore, in the simulation, the branching filter used in the present invention is constructed using the serial arm SAW resonator 106a as the Rx-branching circuit 106. The conventional branching filter used in this simulation has the transmitting SAW filter and receiving SAW filter housed on different piezo electric base boards. The Rx-branching circuit and the frequency regulating LC circuit are put on the package base board which carries the different piezo electric base board on which the transmitting SAW filter and the receiving SAW filter are formed.

FIG. 9 shows the type of branching filters, the required parameters and the impedance values of various branching circuits used to obtain the simulation results. In FIG. 9, symbols A and B denote branching filters with conventional construction, symbols C to E denote branching filters constructed as in the present invention. These branching filters are branching filters that use SAW resonators and are used for mobile cellular phones. The transmitting frequency band is from 890 MHz to 915 MHz, and the receiving frequency band is from 935 MHZ to 960 MHz, which are used by the GSM type branching filter.

According to FIG. 9, in conventional branching filter A, Tx-branching circuit is not included in the branching circuit (line length LT=0 mm), but rather the Rx-branching circuit with the line length LR=40 mm is included. There is also no frequency regulating LC circuit. Therefore, the input terminal of the transmitting SAW filter and the input terminal of the Rx-branching circuit are directly connected to the antenna terminal.

In addition, in the conventional branching filter B, the Tx-branching circuit and the Rx-branching circuit are not included as part of the branching circuit (line length LT and LR=0 mm). There is also no frequency regulating LC circuit. Therefore, the input terminals of both the transmitting SAW filter and the receiving SAW filter are directly connected to the antenna terminal.

In the three types of branching filters C to E used as the subject of this simulation, the Tx-branching circuit 105 is not included as shown in the circuit diagram of FIG. 1. Therefore, the input terminal of the transmitting SAW filter is directly connected to the impedance matching LC circuit 102. In addition, in the branching filters C to E, the serial arm SAW resonator 106a is included in the Rx-branching filter circuit 106. The serial arm SAW resonator 106a consists of the first stage serial arm SAW resonator 109a of the receiving SAW filter 109, and the combined resonator 109g.

Based on the conditions set above, in the branching filter C, the capacitor CANT (capacitance=10 pF) and the inductor $L_{ANT}$ (inductance=7 nH) are available for the impedance matching LC circuit 102 housed outside of the module. In the branching filter D, no capacitor CANT is used, and only the inductor $L_{ANT}$ (inductance=7 nH) is available for the impedance matching LC circuit 102. Similarly, in the branching filter E, there is no capacitor $C_{ANT}$, and only the inductor $L_{ANT}$ (inductance=10 nH) is available for the impedance matching LC circuit 102. Therefore, in the branching filters C to E of the present invention, the improvement of the frequency characteristic of the module depends on the impedance matching LC circuit 102.

In FIG. 10, the real part and the imaginary part of the input impedance $Z_t$ 117 and $Z_t$ 116 of the transmitting SAW filter 108 for both the branching filter B (conventional) and the branching filter D (the present invention) as shown in FIG. 7, are shown respectively. In addition, the value of the input impedance of various transmitting and receiving SAW filters for frequencies of 890 MHz, 915 MHz, 935 MHz and 960 MHz are also shown. The units of the real part values and the imaginary part values in FIG. 10 are ohms and standardized at 50 ohms.

It can be seen from FIG. 10 by comparing the input impedance $Z_t$ and $Z_r$ of the branching filters B and D, that the impedance in the transmitting pass band of the transmitting SAW filter of the branching filter D used in the present invention becomes much larger. To further compare the detailed data, it can be seen from FIG. 10, that the input impedance $Z_r$ of the receiving SAW filter at frequency f=890 MHz for the conventional branching filter B is 0.0127 for the real part and −1.089 for the imaginary part respectively.

On the other hand, the input impedance $Z_r$ for the branching filter D of the present invention is 3.54 for the real part and 23.20 for the imaginary part. As such, it is apparent that the branching filter of the present invention has improved the frequency characteristic to a very large extent. Furthermore, it can be seen from the results of the impedance characteristics shown in FIG. 9, that the transmitting frequency pass band is from 935 MHz to 960 MHz. The branching filter described in the present invention, whose impedance characteristic was studied in the simulation, is the result of miniaturization due to the combining of the first stage serial arm SAW resonator of the receiving SAW filter in the Rx-branching circuit. In the following, the input impedance at the most interesting frequency range for the performance of mobile cellular phones, i.e. at frequency f=900 MHz, is explained.

Looking from the transmitting and receiving SAW filter side at point C 118, shown in FIG. 7, the compound impedance $Z_{in}$ can be calculated according to equation (1-5).

$$Z_{in}=Z_t \times Z_r/(Z_t+Z_r) \qquad (1\text{-}5)$$

In such case, the input impedance of transmitting SAW filter 108 and the receiving SAW filter 109 at frequency f=900 MHz is as follows based on FIG. 10.

$$Z_t(900)=0.863-j0.626 \qquad (1\text{-}6)$$

$$Z_r(900)=0.0175-j0.934 \qquad (1\text{-}7)$$

As such, looking from the transmitting and receiving SAW filter side at point C 118, the impedance $Z_{in}$ can be obtained from equation (1-8).

$$Z_{in}(Tr)(900)=0.2409-j0.501 \qquad (1\text{-}8)$$

When the impedance $Z_{in}$ (Tr) (900) is adjusted by the inductor $L_{ANT}$ 102b in the impedance matching LC circuit 102, the value of the inductance $L_{ANT}$ becomes:

$$L_{ANT}=4.4 \text{ nH} \qquad (1\text{-}9)$$

In this case, when the specific impedance can not reach the expected value, it is necessary to insert an impedance matching circuit. As a matter of fact, for this type of mobile cellular phone, not only at frequency f=900 MHz, but for the transmitting band range between 890 MHz and 915 MHz, an optimal characteristic is required. This optimal characteristic is usually determined through simulation.

FIG. 9 shows the results of impedance adjustment using only the inductor $L_{ANT}$ 102b at the transmitting frequency band range from 890 MHz to 915 MHz for the branching filters D and E. In addition, the results of impedance adjustment using both the inductor $L_{ANT}$ 102b and the capacitor $C_{ANT}$ 102a at the transmitting frequency band range from 890 MHz to 915 MHz for the branching filter C are shown in FIG. 9. The value of the inductor $L_{ANT}$ 102b and capacitor $C_{ANT}$ 102a is matched as one set, at LANT=7.0 nH and CANT=10.0 pF.

Furthermore, as explained by the results shown in FIG. 9, by using the branching filter described in the present invention, and housing the transmitting SAW filter 108 and the receiving SAW filter 109 on the same piezo electric base board, the characteristic of the frequency pass band of the SAW branching filter can be improved using the impedance matching LC circuit 102 housed outside of the module. In addition, due to the fact that the transmitting SAW filter and the receiving SAW filter are formed on the same piezo electric base board, when dicing the transmitting and receiving SAW filter 108 and 109 in wafer conditions, it is not necessary to separate the transmitting SAW filter 108 and the receiving SAW filter 109.

As such, it is not necessary to have the dicing line area on the wafer that was used to ensure proper separation between the transmitting SAW filter 108 and the receiving SAW filter 109 as required by the conventional counterpart. Therefore, it is possible to house more SAW filters on one wafer and improve the yield.

On the other hand, from the results shown in FIG. 10, the impedance at the transmitting band range of the receiving SAW filter 109 becomes much larger due to the fact that the serial arm SAW resonator 106a is used for the branching circuit. This improvement is dependent on the impedance looking from the filter side at point C 118 as shown in FIG. 7. That is to say, it can be considered as the result of inserting the serial arm SAW resonator 106a in the input terminal of the receiving SAW filter 109 as the branching circuit.

The impedance value after the insertion of the serial arm SAW resonator 106a, used as a branching circuit, needs to be adjusted via the impedance matching LC circuit 102 housed outside of the module. By making the frequency regulating LC circuit into a chip and housing it on the transmitting and receiving filter package base board, or housing it on the piezo electric base board on which the transmitting and receiving SAW filter are formed, it is possible to achieve further miniaturization and higher performance for branching filters which contain SAW resonators. In the following, the second to fourth embodiments of the present invention are explained using FIG. 12 to FIG. 15C.

Figure 12:
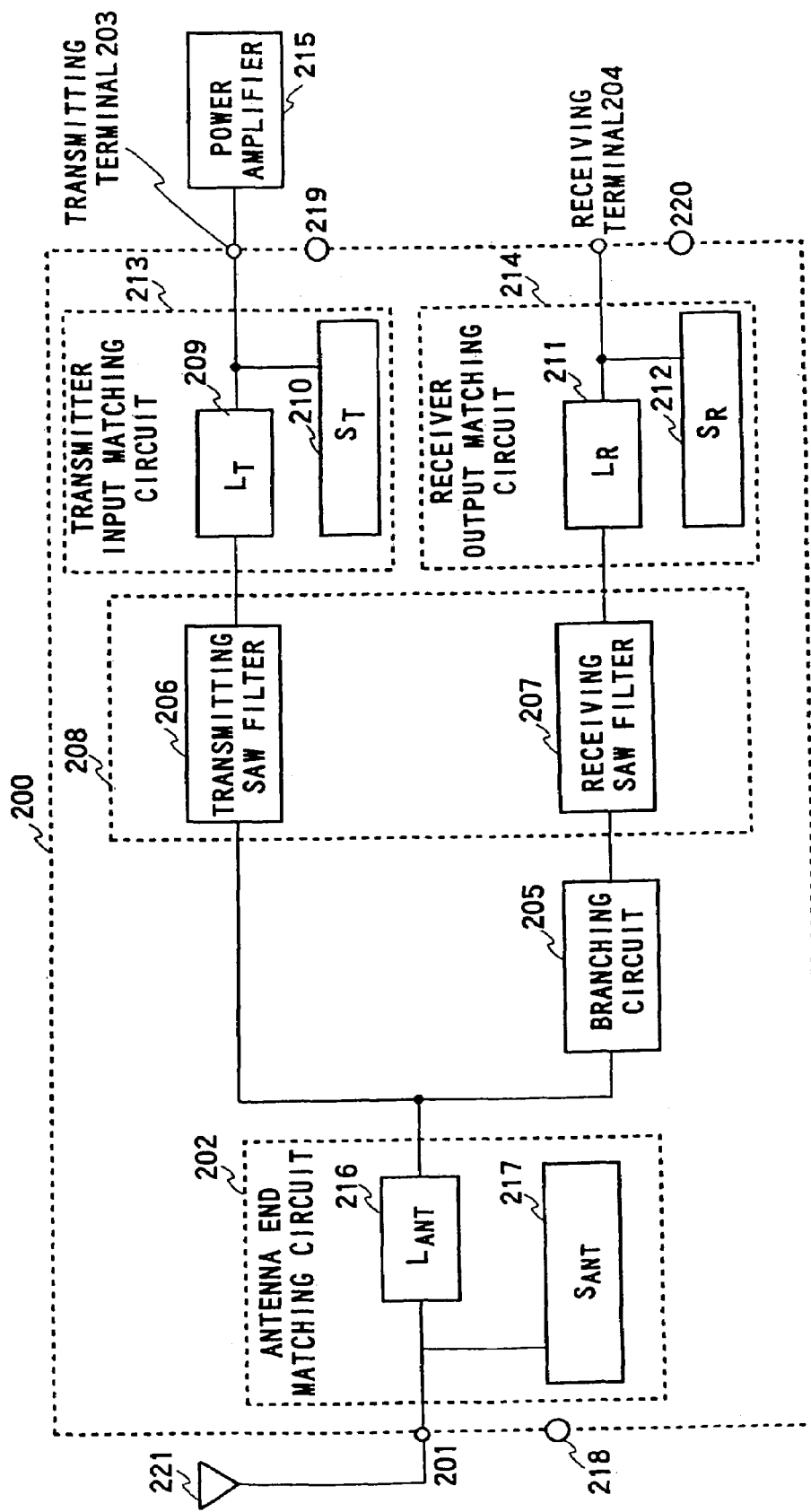
FIG. 12 shows the structure of the SAW branching filter in the second embodiment of the present invention.
Figure 15A:
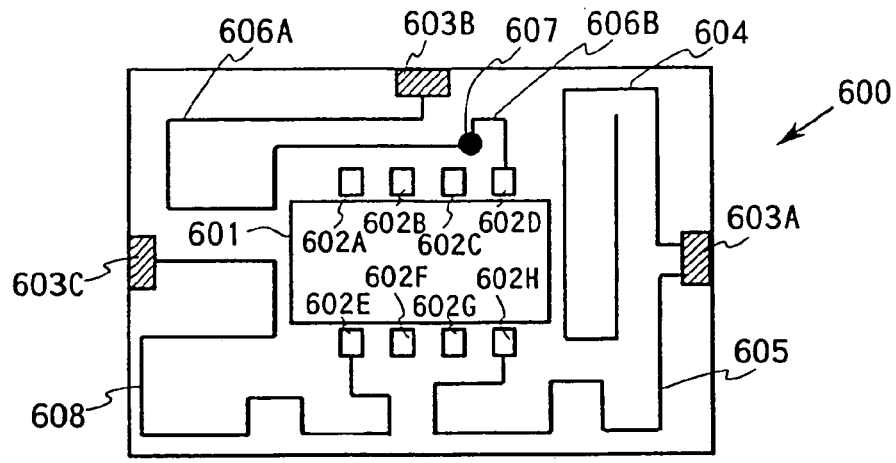
FIGS. 15A to 15C show the plan view of the multi-layer package base board which is used to house the SAW branching filter in the second embodiment of the present invention.
Figure 15B:
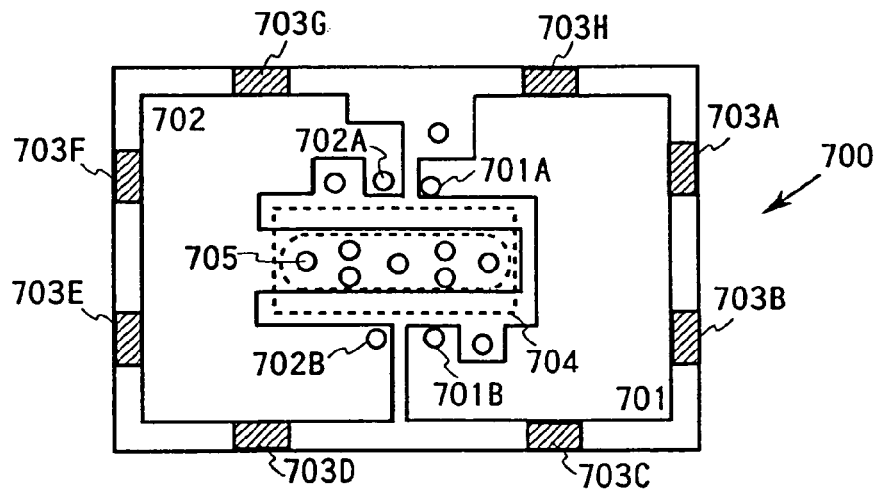
Figure 15C:
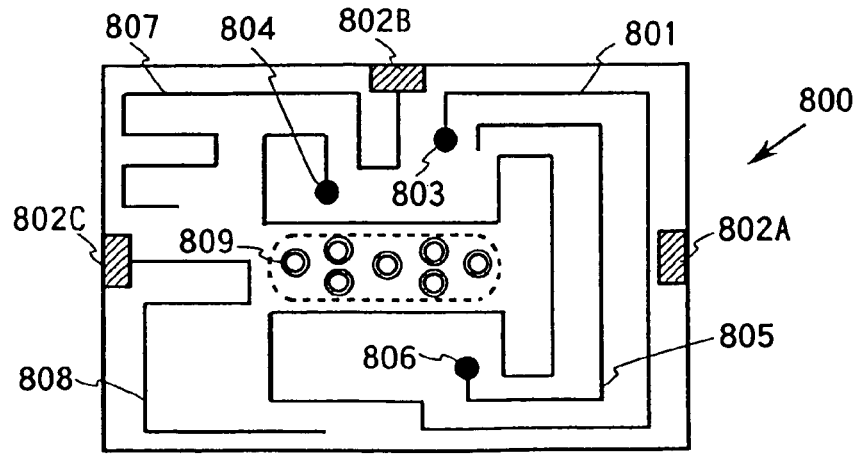

FIG. 12 shows the structure diagram of the SAW branching filter 200 as described in the second embodiment of the present invention. The transmitting and receiving SAW filters 206 and 207 are formed on the same piezo electric base board 208. In addition, the multi-layered package base board which houses the SAW branching filter described in the second embodiment is shown in FIG. 15A to FIG. 15C.

The SAW branching filter 200 described in the second embodiment is constructed as follows. First, as shown in FIG. 12, the transmitting SAW filter 206 and the receiving SAW filter 207 are formed on the same piezo electric base board 208. The antenna terminal matching circuit 202 and the branching circuit 205 are located between the receiving SAW filter 207 and the antenna terminal 201, which is connected to antenna 221. The antenna terminal matching circuit 202 consists of a strip line $L_{ANT}$ 216 used as an inductor, and the open stub $S_{ANT}$ 217 used as a capacitor. In addition, the antenna matching circuit 202 is connected to ground via terminal 218.

The transmitting terminal 203 is connected to the output terminal of the power amplifier 215 and the transmitting input matching circuit 213 is connected between the transmitting terminal 203 and the transmitting SAW filter 206. Here, the transmitting input matching circuit 213 consists of a strip line $L_T$ 209 used as an inductor and a open stub $S_T$ 210 used as a capacitor. In addition, the transmitting input matching circuit 213 is connected to ground via terminal 219.

The receiving output matching circuit 214 is connected between the receiving terminal 204 and the receiving SAW filter 207. Here, the receiving output matching circuit 214 consists of a strip line $L_R$ 211 as an inductor and a open stub $S_R$ 212 as a capacitor. In addition, the receiving output matching circuit 214 is connected to ground via terminal 220.

The following explains the SAW branching filter 200 described above when housed on a multi-layer package base board as shown in FIGS. 15A to 15C.

The multi-layer package base board described in the present invention basically consists of package base boards 600 to 800 as shown in FIG. 15A to FIG. 15C. In the center part of the package base board 600, a cavity 601 is located in order to provide space for the housing of peizo electric base board 208, which in turn is used to house the transmitting SAW filter 206 and 207. In addition, the electrode pads 602A to 602H, the transmitting terminal 603A, the antenna terminal 603B, and the receiving terminal 603C are formed on the package base board 600.

The strip line 605 which is equivalent to the strip line $L_T$ 209 of the transmitting input matching circuit 213 is formed between the transmitting terminal 603A and the electrode pad 602H. Although the transmitting terminal 603A is connected with an open stub 604 in the package base board 600, there is no need for such an arrangement in the second embodiment. On the other hand, the electrode pad 602H is connected to the terminal 806 in the multi-layer package base board. The terminal 806 on the package base board 800 is connected with the open stab 805, which in turn corresponds to the open stab ST210. As such, the input terminal of the transmitting SAW filter 206 is connected to electrode pad 602H via methods such as wire bonding.

The strip line 606A, which is equivalent to the strip line $L_{ANT}$ 216 of the antenna matching circuit 202, is formed between the antenna terminal 603B and the electrode 602D. The antenna terminal 603B is connected to the output terminal of the transmitting SAW filter 206, via terminal 607, wiring 606B and electrode terminal 602D. As shown in FIG. 15C, terminal 607 is connected to terminal 803, and connected to terminal 804 via the branching circuit 801 which corresponds to branching circuit 205.

Terminal 804 is connected to the electrode pad 602A located in the multi-layer package base board, and the electrode pad 602A is further connected to the input terminal of the receiving SAW filter 207 using techniques such as wire bonding. In addition, the antenna terminal 603B is connected to terminal 802B of the package base board 800 located in the multi-layer package base board. The open stab 807 which corresponds to open stub $S_{ANT}$ 217 of the antenna matching circuit 202 is formed on the package base board 800.

The strip line 608, which corresponds to the strip line $L_R$ 211 of the receiving output matching circuit 214, is formed between the receiving terminal 603C and the electrode pad 602E. In addition, as shown in FIG. 15C, the receiving terminal 603C is connected to terminal 802C in the multi-layer package base board. The open stub 808 corresponds to open stub $S_R$ 212 and is also connected to terminal 802C.

The electrode pads 602C and 602G located on the package base board 600 are connected to terminals 701A and 701B located on the package base board 700 in the multi-layer package base board. In addition, the terminals 701A and 701B are located in the ground voltage pattern 701 which is connected to the ground voltage $V_{SS}$ via terminals 703A to 703C and 703H. As such, the electrode pads 602C and 602G located in the package base board 600 are used as ground electrode pads. For example, in the second embodiment, the electrode-pad 602C is used as the ground voltage electrode pad 218 in the antenna terminal matching circuit 202, and the electrode pad 602G is used as ground voltage electrode pad 219 in the transmitting input matching circuit 213.

Similarly, the electrode pads 602B and 602F located in the package base board 600 are connected to terminals 702A and 702B of the package base board 700 in the multi-layer package base board. In addition, terminals 702A and 702B are located in the ground voltage pattern 702 which is connected to the ground voltage $V_{SS}$ via terminals 703D to 703G As such, the electrode pads 602B and 602F located in the package base board 600 are used as ground electrode pads. For example, in the second embodiment, the electrode pad 602B is used as the ground voltage electrode pad 218 in the antenna terminal matching circuit 202, and the electrode pad 602F is used as the ground voltage electrode pad 220 in the receiving output matching circuit 214.

The piezo electric base board 208, on which the transmitting and receiving SAW filters 206 and 207 are formed, is housed in the chip housing area 704 on the package base board 700. In addition, in the ground voltage pattern 702 of the chip housing area 704, multiple through holes 705 are provided. These through holes 705 are connected to the multiple through holes 809 located on the package base board 800 of the multi-layer package base board.

As shown above, for the branching package described in the second embodiment, the transmitting SAW filter 206 and the receiving SAW filter 207 are formed on the same piezo electric base board 208. By housing the piezo electric base board 208 on the multi-layer package base board, it is possible to achieve further miniaturization of the SAW branching filter. In addition, the strip lines $L_T$ 209 (605), $L_R$ 211 (608) and $L_{ANT}$ 216 (606A) are formed on the package base board 600, and the branching circuit 205 (801) and the open stubs ST 210 (805), SR 212 (808) and SANT 217 (807) are formed on the package base board 800. As such, because the strip lines are formed on one package base board, while the branching circuit and the open stabs are formed on another package base board, the SAW branching filter as a whole can be further miniaturized.

In addition, since the various ground voltage patterns related to the transmitting input matching circuit 213 and the receiving output matching circuit 214 are installed separately in package base board 700, it is possible to control the worsening of the frequency characteristic caused by the interference between the transmitting SAW filter 206 and the receiving SAW filter 207.

Furthermore, due to the fact that the through holes 705 and 809 are arranged in the housing area to be used to house the piezo electric base board forming the transmitting SAW filters 206 and 207 in the package base boards 700 and 800, it is possible to radiate the heat generated from the transmitting and receiving SAW filters 206 and 207 efficiently. As such, the reliability of the SAW branching filter is improved.

Next, the operation of the SAW branching filter 200 housed on the multi-layer package base board as described above is explained as follows.

Figure 16:
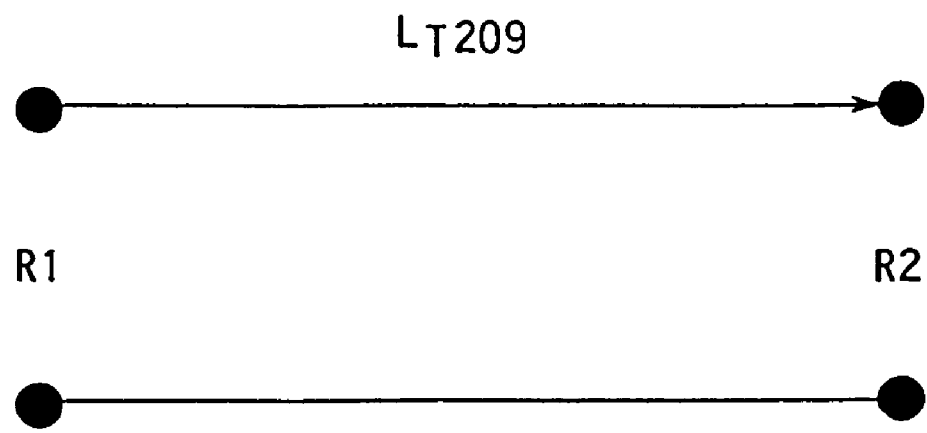
FIG. 16 shows the structure of the matching circuit connection lines used in the branching filter for the second embodiment.
Figure 17:
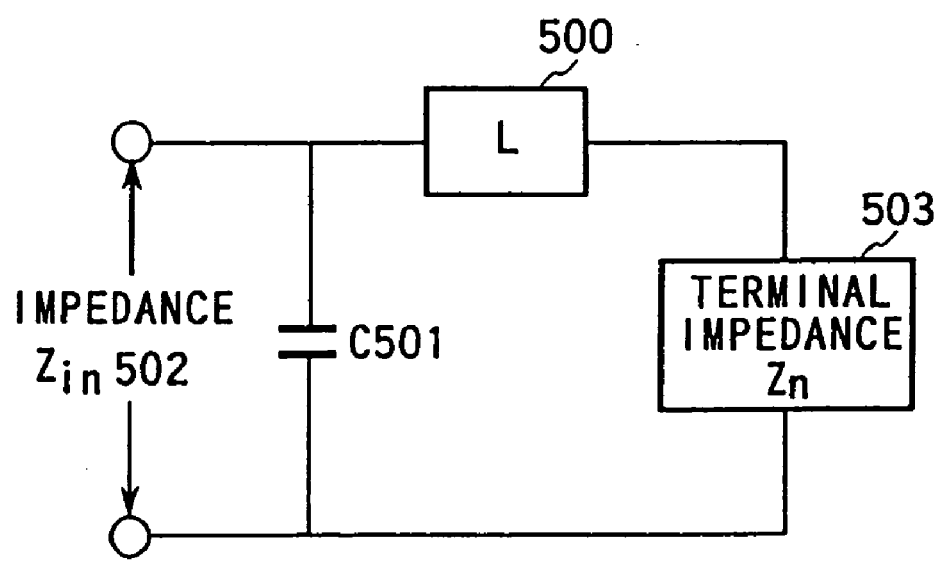
FIG. 17 shows the equivalent LC circuit diagram related to the matching-circuit connection lines used in the branching filter for the second embodiment.

First, the impedance adjusting operation of the matching circuit connection lines in the branching filter is explained using FIG. 16 and FIG. 17. The circuit shown in FIG. 16 and the equivalent LC circuit shown in FIG. 17 must satisfy the following equations (2-1) and (2-2).

$$L=Z_O \times LL/CC \qquad (2\text{-}1)$$

$$C=LL/(CC \times Z_O) \qquad (2\text{-}2)$$

Here, $Z_O$ is the characteristic impedance of the connection circuit, LL is the connection length (cm), and CC=3.0×10¹⁰.

Figure 14:
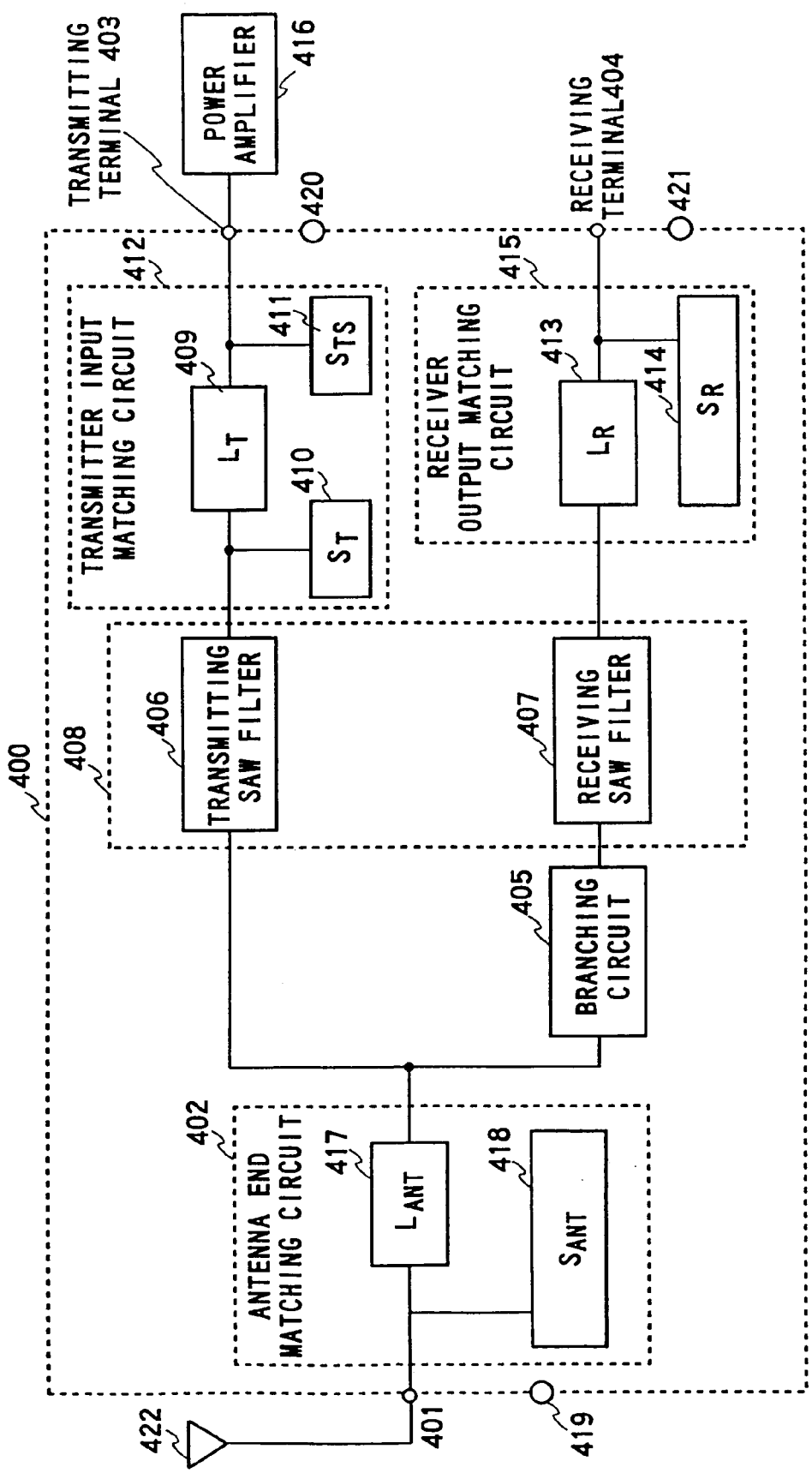
FIG. 14 shows the structure of the SAW branching filter in the fourth embodiment of the present invention.

The impedance $Z_{in}$ of the branching circuit or the SAW filter including the connection circuit shown in FIG. 14 can be calculated using equation (2-3).

$$Z_{in}=(Z_n+jWL)/(1+jWC(Z_n+jWL)) \qquad (2\text{-}3)$$

Here W=2pf (f: frequency)

Next, the connection line (strip line $L_t$ 209) of the transmitting input matching circuit 213 described in detail in the second embodiment of the present invention shown in FIG. 12 is explained. If the connection line (strip line $L_t$ 209) equivalent length is taken to be 11.85 mm, the line width is taken to be 0.1 mm, the thickness of the base board is taken to be 0.2 mm+0.2 mm=0.4 mm, the thickness of the circuit is taken to be 0.02 mm, and the dielectric constant of the package base board, on which the connection line is formed, is taken to be 5.0 (refer to FIG. 18), the characteristic impedance of the connection line equals to 53.6 ohm.

From the above calculation, the equivalent LC value of FIG. 17, as shown in FIG. 19, is L=4.73 nH, and C=1.65 pF.

Concerning strip line $L_t$ 209 (L=4.73 nH, C=1.65 pF), as shown in FIG. 17, the change in input impedance Zin according to the changes of the terminal impedance Zn is shown in FIG. 20.

As it can been seen from FIG. 20, for example, when the terminal impedance $Z_n$ equals to 30 ohms, the input impedance $Z_{in}$ becomes 46.7−j18.2. That is to say, the impedance value $Z_{in}$ of the SAW branching filter can be set as expected via the use of the connection lines such as the strip lines. In addition, it is possible to have a circuit with even a lower loss by setting the impedance in the branching circuit 205 to a lower value. In the second embodiment, if the line width of the branching circuit is set to 0.2 mm, and the thickness of the base board is set to 0.4 mm, the characteristic impedance of the branching circuit in the SAW branching filter 200 can be set to 40.2 ohm, which achieves lower SAW branching filter loss.

Next, the operation of the open stub (open circuit) of the matching circuit in the branching circuit is explained as follows. The impedance $Z_{inf}$ of this open stab can be calculated using equation (2-4).

$$Z_{inf}=-jcot(2p\ LL/s) \qquad (2\text{-}4)$$

Here, the open circuit (open stub ST 210) of the transmitting input matching circuit 213 in the second embodiment is explained concretely. For the transmitting input matching circuit 213, if LL=10.32 mm, the equivalent capacitor $C_{inf}$ is 2.63 pF. In other words, depending on the use of the open stub $S_T$210, in a specific frequency band range, it is possible to adjust the characteristic impedance of the connection line of the strip line to an expected value. That is to say, depending on the effect of the open circuit (open stab), the imaginary part of the characteristic impedance according to the connection line can be changed from positive values to negative values.

Figure 13:
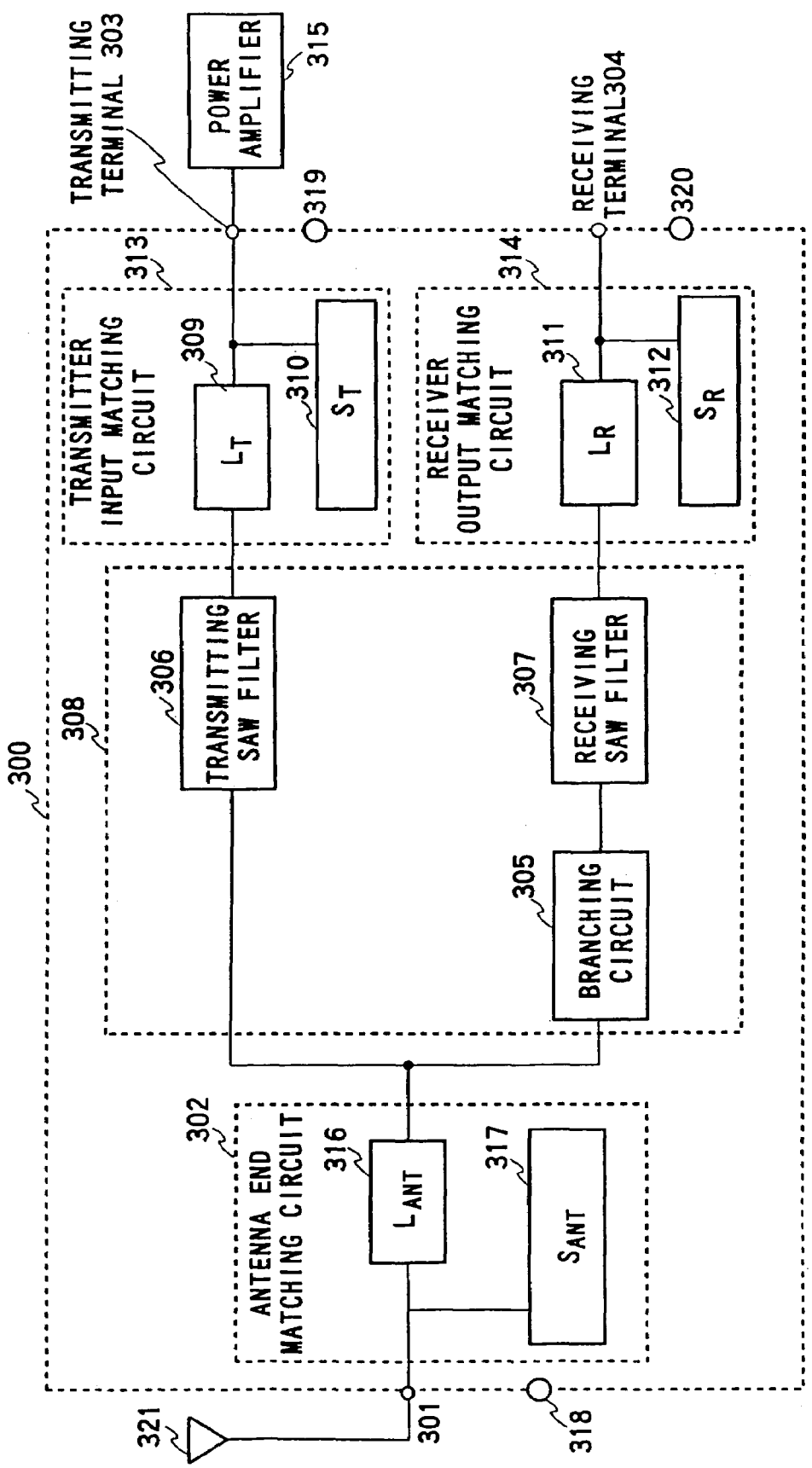
FIG. 13 shows the structure of the SAW branching filter in the third embodiment of the present invention.

FIG. 13 shows the structure diagram of a SAW branching filter 300 for the third embodiment of the present invention. The branching circuit 305, the transmitting SAW filter 306 and the receiving SAW filter 307 are formed on one piezo electric base board 308. In addition, for the third embodiment of the present invention, the multi-layer package base board which is used to house the SAW branching filter is explained through FIG. 15A to FIG. 15C.

The SAW branching filter 300 described in the third embodiment is constructed as follows. First, as shown in FIG. 13, the branching circuit 305, the transmitting SAW filter 306, and the receiving SAW filter 307 are formed on a single piezo electric base board 308. The branching circuit 305 is located between the antenna terminal 301, which is linked to antenna 321, and the receiving SAW filter 307. The antenna terminal matching circuit 302 is located between the antenna terminal 301 and the branching circuit 305. Here, the antenna terminal matching circuit 302 consists of the strip line $L_{ANT}$ 316 used as an inductor and the open stub $S_{ANT}$ 317 used as a capacitor. In addition, the antenna terminal matching circuit 302 is linked to ground via terminal 318.

The transmitting terminal 303 is connected to the output terminal of the power amplifier 315. The transmitting input matching circuit 313 is connected between the transmitting terminal 303 and the transmitting SAW filter 306. Here, the transmitting input matching circuit 313 consists of the strip line $L_T$ 309 used as an inductor and the open stub $S_T$ 310 used as a capacitor. In addition, the transmitting input matching circuit 313 is connected to ground via terminal 319.

The receiving output matching circuit 314 is connected between the receiving terminal 304 and the receiving SAW filter 307. Here, the receiving output matching circuit 314 consists of the strip line $L_R$ 311 used as an inductor, and the open stub $S_R$ 312 used as a capacitor. In addition, the receiving output matching circuit 314 is connected to ground via terminal 320.

FIG. 15A to 15C show the structure of the SAW branching filter 300 described above when housed on a multi-layer package base board and is explained as follows.

The multi-layer package base board described in the present invention, in foundation, is derived from the package base boards 600 to 800.

In the center area of the package base board 600, a cavity 601 is formed to house the piezo electric base board 308 of the receiving SAW filter 306 and 307. Furthermore, the electrode pads 602A to 602H, the transmitting terminal 603A, the antenna terminal 603A, the antenna terminal 603B and the receiving terminal 603C are formed on the package base board 600.

The strip line 605 corresponding to the strip line $L_T$ 309 of the transmitting input matching circuit 313 is formed between the transmitting terminal 603A and the electrode pad 602H. In addition, although the open stab 604 is connected to the transmitting terminal 603A in package base board 600, there is no need for such arrangement in the third embodiment. On the other hand, electrode pad 602H is connected to terminal 806 in the multi-layer package base board, and the terminal 806 is connected to the open stab 805 which corresponds to the open stub ST 310 in the package base board 800. Furthermore, the electrode pad 602H is connected to the input terminal of the transmitting SAW filter 306 using a wire bonding method.

The strip line 606A, which corresponds to strip line LANT 316 of the antenna matching circuit 302, is connected between the antenna terminal 603B and the electrode pad 602D. The antenna terminal 603B is further connected to the output terminal of the transmitting SAW filter 306 via terminal 607, circuit 606B and electrode terminal 602D. In the third embodiment, since the branching circuit 305 is formed on the piezo electric base board 308 along with the transmitting and receiving SAW filters, there is no need to include branching circuit 801 as shown in FIG. 15C. In addition, antenna terminal 603B is connected to terminal 802B of the package base board 800 in the multi-layer package base board, and the open stab 807 which corresponds to the open stub $S_{ANT}$ 317 of the antenna end matching circuit 302 is formed in the package base board 800.

The strip line 608, which corresponds to the strip line $L_R$ 311 of the receiving output matching circuit 314, is formed between receiving terminal 603C and the electrode pad 602E. In addition, as shown in FIG. 15C, the receiving terminal 603C is connected to the terminal 802C in the multi-layer package base board. In other words, the open stub 808 corresponding to open stub $S_R$ 312 and is also connected to the terminal 802C.

The electrode pads 602C and 602G in the package base board 600 are connected to terminals 701A and 701B of the package base board 700, in the multi-layer package board 700, respectively. In addition, terminals 701A and 701B are set up in the ground voltage pattern 701 connected to the ground voltage $V_{SS}$ through terminals 703A to 703C and 703H. As such, the electrode pads 602C and 602G in the package base board 600 can be used as ground voltage electrode pads. For example, in the third embodiment, the electrode pad 602C is used as the ground voltage electrode pad 318 in the antenna terminal matching circuit 302, and the electrode pad 602G is used as the ground voltage electrode pad 319 in the transmitting input matching circuit 313.

Similarly, the electrode pads 602B and 602F in the package base board 600 are connected to terminals 702A and 702B in the package base board 700 of the multi-layer package board. In addition, terminals 702A and 702B are set up in the ground voltage pattern 702 which is connected to the ground voltage $V_{SS}$ via terminals 703D to 703G, respectively. As such, the electrode pads 602B and 602F in the package base board 600 are used as ground voltage electrode pads. For example, in the third embodiment, the electrode pad 602B is used as the ground voltage electrode pad 318 in the antenna end matching circuit 302, and the electrode pad 602F is used as the ground voltage electrode pad 320 in the receiving output matching circuit 314.

The branching circuit 305 and the transmitting and receiving SAW filters 306 and 307 are formed on the piezo electric base board 308, and are housed on the chip housing area 704 on package base board 700. In addition, in the ground voltage pattern 702 of the chip housing area 704, multiple through holes 705 are set up. These through holes 705 are connected to the multiple through holes 809 set up in the package base board 800 of the multi-layer package base board.

As shown above, based on the branching filter package describe in the third embodiment, the branching filter circuit 305, the transmitting SAW filter 306 and the receiving SAW filter 307 are formed on a single piezo electric base board 308. Furthermore, the piezo electric base board 308 is housed in the multi-layer package base board, thus enabling further miniaturization of the whole SAW branching filter. Still more, the strip lines $L_T$ 309 (605), $L_R$ 311 (608) and $L_{ANT}$ 316 (606A) are formed on the package base board 700. On the other hand, the open stubs $S_T$ 310 (805), $S_R$ 312 (808) and $S_{ANT}$ 317 (807) are formed on the package base board 800. That is to say, because the strip lines are formed along with the branching circuit and the open stub on different package base boards, further miniaturization for the whole branching filter is achieved. In addition, because the branching circuit 305 is formed on the piezo electric base board 308 with small loss, it is possible to improve the frequency characteristic of the SAW branching filter 300.

Furthermore, with respect to the package base board 700, because the transmitting input matching circuit 313 and the receiving output matching circuit 314 and their related ground voltage pattern are separately setup, it is possible to control the worsening of the frequency characteristic of the SAW branching filter due to the interference between the transmitting SAW filter 306 and the receiving SAW filter 307.

In addition, since the through holes 705 and 809 are setup in the housing area which is used to house the piezo electric base board forming the transmitting and receiving SAW filters 306 and 307 on the package base boards 700 and 800, it is possible to radiate the heat generated from the transmitting and receiving SAW filters 306 and 307 efficiently to the outside, and further improve the reliability of the SAW branching filter 300.

FIG. 14 shows the structure diagram of the SAW branching filter 400 described in the fourth embodiment of the present invention. The transmitting SAW filter 406 and the receiving SAW filter 407 are formed on a single piezo electric base board 408. In addition, concerning the fourth embodiment, the multi-layer package base board used to house the SAW branching filter is explained using FIG. 15A to FIG. 15C.

The SAW branching filter 400 described in the fourth embodiment of the present invention is constructed as follows. First, as shown in FIG. 14, the transmitting SAW filter 406 and the receiving SAW filter 407 are formed on a single piezo electric base board 408. The antenna end matching circuit 402 and the branching circuit 405 are set up between the receiving SAW filter 407 and the antenna terminal 401 connected to antenna 422. Here, the antenna end matching circuit 402 consists of the strip line $L_{ANT}$417 used as an inductor, and the open stub $S_{ANT}$418 used as a capacitor. In addition, the antenna end matching circuit 402 is connected to ground via terminal 419.

The transmitting terminal 403 is connected to the output terminal of the power amplifier 416. The transmitting input matching circuit 412 is connected between the transmitting terminal 403 and the transmitting SAW filter 406. Here, the transmitting input matching circuit 412 consists of the strip line $L_T$409 used as an inductor and the open stub $S_T$410 used as a capacitor, and $S_{TS}$411. In addition, the transmitting input matching circuit 412 is connected to ground via terminal 420. Open stab $S_{TS}$411 is used to eliminate spurious noise, with a length which can be calculated from the equation $1=c/(4f(er)^{1/2})$. Here, 1 is the length of the open stab (mm), c is the speed of light (300×106 m/s), f is the frequency to be eliminated and er is the specific inductive capacitance.

The receiving output matching circuit 415 is connected between the receiving terminal 404 and the receiving SAW filter 407. Here, the receiving output matching circuit 415 consists of the strip line $L_R$413 used as an inductor and the open stub $S_R$414 used as a capacitor. In addition, the receiving output matching circuit 415 is connected to ground via terminal 412.

The SAW branching filter 400 constructed as described above when housed on the multi-layer package base board is explained as follows.

The multi-layer package base board described in the present invention basically consists of boards similar to package base board 600 to 800.

In the center area of the package base board 600, a cavity 601 is formed to house the piezo electric base board 408 of the receiving SAW filter 406 and 407. Furthermore, the electrode pads 602A to 602H, the transmitting terminal 603A, the antenna terminal 603B, the antenna terminal 603B and the receiving terminal 603C are formed on the package base board 600.

The strip line 605 corresponding to the strip line $L_T$409 of the receiving input matching circuit 412 is formed between the transmitting terminal 603A and the electrode pad 602H. In addition, the transmitting terminal 603A is connected to open stab 604 corresponding to open stub $S_{TS}$411 on the package base board 600. On the other hand, electrode pad 602H is connected to terminal 806 of the multi-layer package base board. The open stab 805 corresponding to open stub $S_T$410 is connected to the terminal 806 in the package base board 800. The input terminal of the transmitting SAW filter 406 is connected to the electric pad 602H using wire bonding methods. Furthermore, as shown in FIG. 15C, terminal 607 is connected to terminal 803, and connected to terminal 804 via the branching circuit 801 corresponding to branching circuit 405, and the electrode pad 602A is connected to the input terminal of the receiving SAW filter 407 using wire bonding methods.

The strip line 606A, which corresponds to the strip line $L_{ANT}$ 417 of the antenna end matching circuit 402, is connected between the antenna terminal 603B and the electrode pad 602D. Antenna terminal 603B is connected to the output terminal of the transmitting SAW filter 406 via terminal 607, circuit 606B and electrode terminal 602D. In addition, the antenna terminal 603B is connected to terminal 802B of the package base board 800 in the multi-layer package base board. The open stab 807 corresponding to the open stab $S_{ANT}$ 18 of the antenna end matching circuit 402 is also formed in the package base board 800.

The strip line 608, which corresponds to the strip line $L_R$413 of the receiving output matching circuit 415, is connected between the receiving terminal 603C and the electrode pad 602E. In addition, as shown in FIG. 15C, the receiving terminal 603 is connected to terminal 802C in the multi-layer package base board. Furthermore, open stab 808 corresponding to open stub $S_R$414 is connected to in terminal 802C.

The electrode pads 602C and 602G in the package base board 600 are connected to terminals 701A and 701B of the package base board 700, respectively. In addition, terminals 701A and 701B are set up in the ground voltage pattern 701 connected to the ground voltage $V_{SS}$ via terminals 703A to 703C and 703H. As such, the electrode pads 602C and 602G in the package base board 600 can be used as ground voltage electrode pads. For example, in the fourth embodiment, the electrode pad 602C is used as the ground voltage electrode 419 in the antenna end matching circuit 402, and the electrode pad 602G is used as the ground voltage electrode pad 420 in the transmitting input matching circuit 412.

Similarly, the electrode pads 602B and 602F in the package base board 600 are connected to terminals 702A and 702B of the package base board 700 in the multi-layer package base board. In addition, terminals 702A and 702B, are set up in the ground voltage pattern 702 connected to the ground voltage $V_{SS}$ via terminals 703D to 703D. As such, the electrode pads 602B and 602F in the package base board 600 can be used as ground voltage electrode pads. For example, in the fourth embodiment, the electrode pad 602B is used as the ground voltage electrode 419 in the antenna end matching circuit 402, and the electrode pad 602F is used as the ground voltage electrode pad 421 in the receiving output matching circuit 415.

The transmitting and receiving SAW filters 406 and 407 are formed on the piezo electric base board 408, and are housed on the chip housing area 704 on package base board 700. In addition, in the chip housing area 704 of ground voltage pattern 702, multiple through holes 705 are set up. These through holes 705 are connected to the multiple through holes 809 set up in the package base board 800 of the multi-layer package base board.

As shown above, based on the branching filter package described in the fourth embodiment, the transmitting SAW filter 406 and the receiving SAW filter 407 are formed on a single piezo electric base board 408. Furthermore, the piezo electric base board 408 is housed in the multi-layer package base board, thus enabling further miniaturization of the whole SAW branching filter. Still more, the strip lines $L_T$409 (605), $L_R$ 413 (608) and $L_{ANT}$417 (606A) are formed on the package base board 700. On the other hand, the open stubs $S_T$410 (805), $S_R$414 (808) and $S_{ANT}$418 (807) are formed on the package base board 800. That is to say, the strip lines are formed along with the branching circuit and the open stub on different package base boards, thus achieving further miniaturization for the whole branching filter.

Furthermore, with respect to the package base board 700, because the transmitting input matching circuit 412 and the receiving output matching circuit 415 and their related ground voltage pattern are separately setup, it is possible to control the worsening of the frequency characteristic of the SAW branching filter due to the interference between the transmitting SAW filter 406 and the receiving SAW filter 407.

In addition, since the through holes 705 and 809 are setup in the housing area which is used to house the piezo electric base board forming the transmitting and receiving SAW filters 406 and 407 on the package base boards 700 and 800, it is possible to radiate the heat generated from the transmitting and receiving SAW filters 406 and 407 efficiently to the outside, and further improve the reliability of the SAW branching filter 400.

Furthermore, in the fourth embodiment, since the open stub $S_{TS}$ 411 is set up in the transmitting input matching circuit 412, it is possible to set the spurious band attenuation in the SAW branching filter 400 to an expected value.

Although the present invention has been described by way of exemplary embodiments, it should be understood that many changes and substitutions may be made by those skilled in the art without departing from the spirit and the scope of the present invention which is defined only by the appended claims.

What is claimed is:

1. A surface acoustic wave (SAW) duplexer comprising:
    a transmitting SAW filter having:
        a plurality of first SAW resonators connected to a ground, and
        an output portion;
    a receiving SAW filter having:
        a plurality of second SAW resonators connected to the ground, and
        an input portion, wherein a number of the second SAW resonators is larger than a number of the first SAW resonators;
    a single piezoelectric substrate on which the transmitting and receiving SAW filters are formed;
    a package base board on which the single piezoelectric substrate is mounted;
    an antenna terminal formed on the package base board, wherein the antenna terminal is connected to the output portion of the transmitting SAW filter and the input portion of the receiving SAW filter;
    an input terminal positioned on the package base board, the antenna terminal being electrically connected to the input portion of the receiving SAW filter through the input terminal of the package base board; and
    an output terminal positioned on the package base board, the antenna terminal being electrically connected to the output portion of the transmitting SAW filter through the output terminal of the package base board,
    wherein a distance between the input terminal and the output terminal of the package base board is greater than a distance between the output portion of the transmitting SAW filter and the input portion of the receiving SAW filter.

2. A surface acoustic wave duplexer according to claim 1, wherein the output terminal of the package base board is positioned closer to the output portion of the transmitting SAW filter than the input portion of the receiving SAW filter, and wherein the input terminal of the package base board is positioned closer to the input portion of the receiving SAW filter than the output portion of the transmitting SAW filter.

3. The surface acoustic wave duplexer according to claim 2, further comprising:
    a first interconnection line which connects the input terminal of the package base board and the input portion of the receiving SAW filter; and
    a second interconnection line which connects the output terminal of the package base board and the output portion of the transmitting SAW filter.

4. The surface acoustic wave duplexer according to claim 3, wherein both of the first and second interconnection lines extend substantially parallel to one direction.

5. The surface acoustic wave duplexer according to claim 2, wherein a direction from the output portion of the receiving SAW filter to the output terminal of the package base board is different than a direction from the input portion of the transmitting SAW filter to the input terminal of the package base board.

6. The surface acoustic wave duplexer according to claim 5, wherein the directions are opposite to each other.

7. A surface acoustic wave duplexer, comprising:
    a transmitting SAW filter having a plurality of first SAW resonators connected to a ground;
    a receiving SAW filter having a plurality of second SAW resonators connected to the ground, wherein a number of the second SAW resonators is greater than a number of the first SAW resonators;
    a single piezoelectric substrate on which the transmitting and receiving SAW filters are formed;
    a package base board on which the single piezoelectric substrate is mounted;
    an antenna terminal formed on the package base board, wherein the antenna terminal is connected to the transmitting and receiving SAW filters;
    a plurality of sub package base boards constituting the package base board; and
    a plurality of ground voltage patterns formed on one of the sub package base boards, the ground voltage patterns being electrically connected to the transmitting and receiving SAW filters.

8. A surface acoustic wave duplexer, comprising:
    a transmitting SAW filter having a plurality of first SAW resonators connected to a ground;
    a receiving SAW filter having a plurality of second SAW resonators connected to the ground, wherein a number of the second SAW resonators is greater than a number of the first SAW resonators;
    a single piezoelectric substrate on which the transmitting and receiving SAW filters are formed;
    a package base board on which the single piezoelectric substrate is mounted, wherein the package base board comprises a heat radiating opening that radiates heat generated from the transmitting and receiving SAW filters; and
    an antenna terminal formed on the package base board, wherein the antenna terminal is connected to the transmitting and receiving SAW filters.

9. A surface acoustic wave (SAW) duplexer comprising:
    a transmitting SAW filter having a first input portion, a first output portion, a ground portion and a plurality of first SAW resonators connected to the ground portion;
    a receiving SAW filter having a second input portion, a second output portion, the ground portion and a plurality of second SAW resonators connected to the ground portion, and wherein a number of the second SAW resonators is larger than a number of the first SAW resonators;

a single piezoelectric substrate on which the transmitting and receiving SAW filters are arranged in series in an arranging direction, wherein the single piezoelectric substrate has first and second sides which face each other in an orthogonal direction, the orthogonal direction being orthogonal to the arranging direction;

a package base board on which the single piezoelectric substrate is mounted; and an antenna terminal formed on the package base board, wherein the antenna terminal is connected to the first output portion and the second input portion, wherein the first output portion of the transmitting SAW filter is positioned closer to the first side than the second side, and the second input portion of the receiving SAW filter is positioned closer to the second side than the first side.

10. The surface acoustic wave duplexer according to claim 9, wherein the first output portion of the transmitting SAW filter is positioned in vicinity to the first side.

11. The surface acoustic wave duplexer according to claim 9, wherein the second input portion of the receiving SAW filter is positioned in vicinity to the second side.

12. The surface acoustic wave duplexer according to claim 9, wherein the first input portion of the transmitting SAW filter is positioned closer to the second side than the first side, and the second output portion of the receiving SAW filter is positioned closer to the first side than the second side.

13. The surface acoustic wave duplexer according to claim 9, wherein the single piezoelectric substrate has third and fourth end portions which face each other in the arranging direction, and wherein the first output portion of the transmitting SAW filter is positioned closer to the third side than the fourth side, and the second input portion of the receiving SAW filter is positioned closer to the fourth side than the third side.

14. The surface acoustic wave duplexer according to claim 13, wherein the first output portion of the transmitting SAW filter is positioned in vicinity to the third side.

15. The surface acoustic wave duplexer according to claim 13, wherein the second input portion of the receiving SAW filter is positioned in vicinity to the fourth side.

16. The surface acoustic wave duplexer according to claim 13, wherein the first input portion of the transmitting SAW filter is positioned closer to the second side than the first side, and the second output portion of the receiving SAW filter is positioned closer to the first side than the second side.

* * * * *